(12) United States Patent
Hsu et al.

(10) Patent No.: US 8,355,287 B2
(45) Date of Patent: Jan. 15, 2013

(54) METHOD AND APPARATUS FOR OPERATION OF A NAND-LIKE DUAL CHARGE RETAINING TRANSISTOR NOR FLASH MEMORY DEVICE

(75) Inventors: Fu-Chang Hsu, San Jose, CA (US); Peter W. Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 189 days.

(21) Appl. No.: 12/806,848

(22) Filed: Aug. 23, 2010

(65) Prior Publication Data
US 2011/0051524 A1   Mar. 3, 2011

Related U.S. Application Data

(60) Provisional application No. 61/275,148, filed on Aug. 25, 2009.

(51) Int. Cl.
*G11C 16/06* (2006.01)
*G11C 16/04* (2006.01)

(52) U.S. Cl. ......... 365/185.22; 365/185.24; 365/185.03; 365/185.17; 365/185.29; 365/185.33

(58) Field of Classification Search ............. 365/185.22, 365/185.24, 185.2, 185.33, 185.03, 185.17, 365/185.29
See application file for complete search history.

(56) References Cited

U.S. PATENT DOCUMENTS

| | | | |
|---|---|---|---|
| 5,153,853 | A | 10/1992 | Eby et al. |
| 5,949,711 | A | 9/1999 | Kazerounian |
| 5,953,255 | A | 9/1999 | Lee |
| 6,212,102 | B1 | 4/2001 | Georgakos et al. |
| 6,288,944 | B1 | 9/2001 | Kawamura |
| 6,307,781 | B1 | 10/2001 | Shum |
| 6,407,948 | B1 | 6/2002 | Chou |
| 6,614,292 | B1 | 9/2003 | Chung et al. |
| 6,628,544 | B2 | 9/2003 | Shum et al. |
| 6,980,472 | B2 | 12/2005 | Ditewig et al. |
| 2003/0141541 | A1 | 7/2003 | Wu |
| 2004/0105308 | A1 | 6/2004 | Matsunaga et al. |
| 2005/0265081 | A1 | 12/2005 | Tran et al. |
| 2007/0064480 | A1 | 3/2007 | Kuo et al. |
| 2007/0279994 | A1 | 12/2007 | Mokhlesi et al. |
| 2009/0279360 | A1 | 11/2009 | Lee et al. |

OTHER PUBLICATIONS

PCT/US 10/02342 International Search Report, Oct. 19, 2010, Aplus Flash Technology, Inc.

*Primary Examiner* — Hoai V Ho
*Assistant Examiner* — Tri Hoang
(74) *Attorney, Agent, or Firm* — Saile Ackerman LLC; Stephen B. Ackerman; Billy Knowles

(57) ABSTRACT

A method and apparatus for operation for the NAND-like dual charge retaining transistor NOR flash memory cells begins by erasing, verifying over-erasing the threshold voltage level of the erased charge retaining transistors to an erased threshold voltage level. Then method progresses by programming one of two charge retaining transistors of the NAND-like dual charge retaining transistor NOR flash memory cells to a first programmed threshold voltage level, and programming the other of the two charge retaining transistors of the NAND-like dual charge retaining transistor NOR flash memory cells to the first programmed threshold voltage level or to a second programmed threshold voltage level. Combinations of the erased threshold voltage level and the first and second programmed threshold voltage levels determine an internal data state of the NAND-like dual charge retaining transistor NOR flash memory cells which are then decoded to ascertain the external data logical state.

27 Claims, 15 Drawing Sheets

FIG. 4a

| Vt of (M0,M1) | Vgs1-Vt M0 | Vgs2-Vt M1 | Icell | Internal State of M0 |
|---|---|---|---|---|
| Upper WL | | | | |
| (Vt1, Vt0) | 2.7-1.25=1.45 | 4.5+1.8=6.3 | Iref1<Icell<Iref2 | 1 |
| (Vt0, Vt1) | 2.7+1.8=4.5 | 4.5-1.25=3.25 | Iref2<Icell | 0 |
| (Vt1, Vt1) | 2.7-1.25=1.45 | 4.5-1.25=3.25 | Iref1<Icell<Iref2 | 1 |
| (Vt0, Vt2) | 2.7+1.8=4.5 | 4.5-5=-0.5 | Icell=0 | 0 |

| Vt of (M0,M1) | Vgs0-Vt M0 | Vgs1-Vt M1 | Icell | Internal State of M1 |
|---|---|---|---|---|
| Lower WL | | | | |
| (Vt1, Vt0) | 4.5-1.25=3.25 | 2.7+1.8=4.5 | Iref2<Icell | 0 |
| (Vt0, Vt1) | 4.5+1.8=6.3 | 2.7-1.25=1.45 | Iref1<Icell<Iref2 | 1 |
| (Vt1, Vt1) | 4.5-1.25=3.25 | 2.7-1.25=1.45 | Iref1<Icell<Iref2 | 1 |
| (Vt0, Vt2) | 4.5+1.8=6.3 | 2.7-5=-2.3 | Icell=0 | 0 |

FIG. 4b

| Vt of (M0,M1) | Internal Logic State (B1,B0) | External Logic State (B'1,B'0) | Program M0's Vt | Program M1's Vt |
|---|---|---|---|---|
| (Vt1, Vt0) | (1,0) | (1,1) | 1. Vt0 NOT B'1 | 1. Vt0 B'0 AND B'1 |
| (Vt0, Vt1) | (0,1) | (0,1) | 2. Vt1 B'1 | 2. Vt1 B'0 XOR B'1 |
| (Vt1, Vt1) | (1,1) | (1,0) | | 3. Vt2 B'0 NOT OR B'1 |
| (Vt0, Vt2) | (0,0) | (0,0) | | |

| Voltage \ Mode | SEL SECTOR | | | | | | | | | |
|---|---|---|---|---|---|---|---|---|---|---|
| | Unsel Paired WL | Sel Paired WL Upper (WL0) | Sel Paired WL Lower (WL1) | LBL | LSL | BLC Sel | BLC Unsel | SLG Sel | SLG Unsel | TPW |
| Paired-WL Page Erase | 20V* | 0V | 0V | 20V~ | 20V~ | Vdd | Vdd | Vdd | Vdd | 20V |
| Paired-WL Erase Verify | 0V | 0V | 0V | 1V/0V | 1V | Vdd | 0V | Vdd | 0V | 0V |
| Block Erase | 20V* | 20V* | 0V | 20V~ | 20V~ | Vdd | Vdd | Vdd | Vdd | 20V |
| Single WL Erase Verify | 0V | Vpass | 0V | 1V/0V | 1V | Vdd | 0V | Vdd | 0V | 0V |
| Sector/Chip Erase | NA | 20V* | 0V | 20V~ | 20V~ | Vdd | Vdd | Vdd | Vdd | 20V" |

Vpass=4.5V

20V*: Coupled from Array's TPW
20V~: Forwarded from Array's TPW
20V": Selected Sector's TPW is 20V
Unselected Sector's TPW is 0V

FIG. 10

| Voltage / Mode | Unsel Paired WL | Sel Paired WL Upper (WL0) | Sel Paired WL Lower (WL1) | LBL | LSL | BLC Sel | BLC Unsel | SLG Sel | SLG Unsel | TPW |
|---|---|---|---|---|---|---|---|---|---|---|
| Block Pre-program | 0V | 20V | 0V | 0V | 0V | Vdd | Vdd | Vdd | Vdd | 0V |
| Block Pre-program Verify | 0V | Vt1L | >6V | Vdd−Vt /0V | 0V | Vdd | Vdd | Vdd | Vdd | 0V |
| Sector/Chip Pre-program | 0V / NA | 20"V | 0V | 0V | 0V | Vdd | Vdd | Vdd | Vdd | 0V |
| Sector/Chip Pre-program Verify | 0V / NA | Vt1L | >6V | Vdd−Vt /0V | 0V | Vdd | Vdd | Vdd | Vdd | 0V |

20V": Selected Sector's UPPER WL is 20V
Unselected Sector's ALL WL'S are 0V

FIG. 11

| Voltage / Mode | Unsel Paired WL | Sel Paired WL Upper (WL0) | Sel Paired WL Lower (WL1) | LBL | LSL | BLG Sel | BLG Unsel | SLG Sel | SLG Unsel | TPW |
|---|---|---|---|---|---|---|---|---|---|---|
| Upper WL Page Program | Vpass | 15V~20V | Vpass | 0V/~8V | 0V/~8V | 10V | 0V | 10V | 0V | 0V |
| Lower WL Page Program | Vpass | Vpass | 15V~20V | 0V/~8V | 0V/~8V | 10V | 0V | 10V | 0V | 0V |
| Upper WL Page Program Verify | 0V | Vt1L | Vpass | Vdd-Vt/0V | 0V | Vdd | 0V | Vdd | 0V | 0V |
| Upper WL Page Program Verify Vt1 | 0V | Vpass | Vt1L | Vdd-Vt/0V | 0V | Vdd | 0V | Vdd | 0V | 0V |
| Upper WL Page Program Verify Vt2 | 0V | Vpass | Vt2L | Vdd-Vt/0V | 0V | Vdd | 0V | Vdd | 0V | 0V |

Vpass=4.5V
20V*: Coupled from Array's TPW
20V~: Forwarded from Array's TPW
20V'': Selected Sector's TPW is 20V
20V''': Unselected Sector's TPW is 0V

FIG. 13

| | SEL SECTOR | | | | | | | |
|---|---|---|---|---|---|---|---|---|
| Voltage \ Mode | Unsel Paired WL | Sel Paired WL | | LBL | LSL | BLG | | SLG | | TPW |
| | | Sel | Unsel | | | Sel | Unsel | Sel | Unsel | |
| Read | 0V | VR | Vpass | 1V | 0V | Vdd | 0V | Vdd | 0V | 0V |

Vdd = 1.6V–1.8V or 2.7V–3.6V
VR = 2.7V; Vpass = 4.5V

FIG. 15

METHOD AND APPARATUS FOR OPERATION OF A NAND-LIKE DUAL CHARGE RETAINING TRANSISTOR NOR FLASH MEMORY DEVICE

This application claims priority under 35 U.S.C. §119 to U.S. Provisional Patent Application U.S. Provisional Patent Application Ser. No. 61/275,148, filed on Aug. 25, 2009, which is herein incorporated by reference in its entirety.

RELATED PATENT APPLICATIONS

U.S. patent application Ser. No. 12/387,771, filed on May 7, 2009, which is herein incorporated by reference in its entirety.

BACKGROUND OF THE INVENTION

1. Field of the Invention

This invention relates generally to nonvolatile memory device structure and operation. More particularly, this invention relates to circuits and method for operation of a NAND like dual charge retaining transistor NOR flash nonvolatile memory device.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge retaining mechanism such as charge storage or a charge trapping. In a charge storage mechanism, as with a floating gate nonvolatile memory, the charge representing digital data is stored on a floating gate of the device. The stored charge modifies the threshold voltage of the floating gate memory cell to determine the digital data stored in the floating gate nonvolatile memory cell. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin to double the address space. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production at the present time use one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memories provide the advantage of in-system program and erase capabilities and have a specification for providing at least 100K endurance cycles. In addition, both single-chip NAND and NOR flash nonvolatile memory products can provide giga-byte density because their highly-scalable cell sizes. For instance, presently a one-bit/one transistor NAND cell size is kept at $\sim4\lambda^2$ ($\lambda$ being a minimum feature size in a semiconductor process), while NOR cell size is $\sim10\lambda^2$. Furthermore, in addition to storing data as a single-level program cell having two voltage thresholds (Vt0 and Vt1), both one transistor NAND and NOR flash nonvolatile memory cells are capable of storing at least two bits per cell or two bits/one transistor with four multi-level threshold voltages (Vt0, Vt1, Vt2 and Vt03) in one physical cell. The multi-level threshold voltage programming of the one transistor NAND and NOR flash nonvolatile memory cells is referred to as multiple level programmed cells (MLC).

Currently, the highest-density of a single-chip double polycrystalline silicon gate NAND flash nonvolatile memory chip is 64 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) injection programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

The act of programming of a Flash nonvolatile memory cell involves charging the charge retaining region (floating gate or charge trapping layer) with electrons which causes the turn-on threshold voltage level of the memory cell to increase. Thus, when programmed, the Flash nonvolatile memory cell will not turn on; that is, it will remain non-conductive, when addressed with a read potential applied to its control gate. Alternately, the act of erasing a Flash nonvolatile memory cell involves removing electrons from the floating gate to lower the threshold voltage level. With the lower threshold voltage level, a Flash nonvolatile memory cell will turn on to a conductive state when addressed with a read potential to the control gate. However, a Flash nonvolatile memory cell suffers from the problem of over-erasure. Over-erasure occurs if, during the erasing step, too many electrons are removed from the floating gate leaving a slight positive charge. This biases the memory cell slightly on, so that a small current may leakage through the memory cell even when it is not addressed.

Currently, as discussed in U.S. Pat. No. 6,407,948 (Chou), the most commonly used Flash memory erasing methods employ the Fowler-Nordheim tunneling phenomena and the channel hot-electron tunneling phenomena. In an erasing operation for a Flash nonvolatile memory cell, a voltage is continually applied to a Flash nonvolatile memory cell to generate a voltage field with a negative potential difference between the control gate and the drain or channel of a Flash nonvolatile memory cell. Electrons accumulated in the floating gate of a Flash nonvolatile memory cell are reduced because the electrons pass through a thin dielectric layer of the Flash nonvolatile memory cell to cause a reduction of the threshold voltage of the Flash memory cell. When the erasing operation is performed, an erasing voltage pulse is applied to each Flash memory cell of a Flash memory array to erase all of the Flash memory cells in the array. However, not all of the Flash memory cells of the Flash memory array have the same circuit characteristics. Some of the Flash memory cells will suffer over-erasure. An over-erased Flash memory cell is one in which a threshold voltage is less than +0.5 volts. When the Flash memory array has multiple over-erased Flash memory cells on multiple columns of the Flash memory cells, the Flash nonvolatile memory cell operates as though it were a depletion device and provides a leakage current. This leakage current causes the data reading accuracy of the Flash memory array to be adversely affected. During a read operation of selected a Flash nonvolatile memory cells, the bit line connected to the selected Flash memory cell is also connected to any over-erased Flash memory cells connected to the bit line. The bit line will suffer from excess leakage current while reading the non-conducting Flash memory cell.

SUMMARY OF THE INVENTION

An object of this invention is to provide a method and apparatus for operation of a NAND-like dual charge retaining transistor NOR flash memory cell for the management of over-erasure.

Another object of this invention is to provide a method and apparatus for operating dual charge retaining transistor NOR flash memory cells to set a threshold voltage level of the dual charge retaining transistor NOR flash memory cells to prevent leakage current from corrupting data during a read or verification operation.

To accomplish at least one of these objects, an embodiment includes a method of operation for the NAND-like dual charge retaining transistor NOR flash memory cells that begins by erasing, verifying over-erasing. The threshold voltage level of the erased charge retaining transistors is an erased threshold voltage level. The method progresses by programming one of two charge retaining transistors of the NAND-like dual charge retaining transistor NOR flash memory cells to a first programmed threshold voltage level, and program verifying the dual charge retaining transistor NOR flash memory cells. If a first charge retaining transistor is programmed to the first programmed threshold voltage level and a second charge retaining transistor remains at the erase threshold voltage level, the paired word line page of NAND-like dual charge retaining transistor NOR flash memory cell is designated to be retaining a first data state. If the first charge retaining transistors remains at the erase threshold voltage level and the second charge retaining transistor is programmed to the first programmed threshold voltage level, the paired word line page of NAND-like dual charge retaining transistor NOR flash memory cell is designated to be retaining a second data state.

The method progresses by programming the other of the two charge retaining transistors of the NAND-like dual charge retaining transistor NOR flash memory cells to the first programmed threshold voltage level or to a second programmed threshold voltage level, and program verifying the dual charge retaining transistor NOR flash memory cells. If a first charge retaining transistor and the second charge retaining transistor are programmed to the first programmed threshold voltage level, the paired word line page of NAND-like dual charge retaining transistor NOR flash memory cell is designated to be retaining a third data state. If the first charge retaining transistors remains at the erase threshold voltage level, the second charge retaining transistor is further programmed to the second programmed threshold voltage level. The paired word line page of NAND-like dual charge retaining transistor NOR flash memory cell is designated to be retaining a fourth data state.

For embodiments where the charge retaining transistors are N-channel devices, the erased threshold voltage level is a negative value less than approximately −1.8V. For embodiments where the charge retaining transistors are P-channel devices, the erased threshold voltage level is approximately +1.8V. One of the two charge retaining transistors of NAND-like dual charge retaining transistor NOR flash memory cells are reprogrammed to a first programmed threshold voltage level to prevent leakage currents leakage current from corrupting data during a read or verification operation.

The NAND-like dual charge retaining transistor NOR flash memory cells have three threshold voltage levels that are designated to define the data states retained by the NAND-like dual charge retaining transistor NOR flash memory cells. In some embodiments, when the first charge retaining transistor has a threshold voltage level of the first programmed threshold voltage level and the second charge retaining transistor has a threshold voltage level of the erased threshold voltage level, the first data state is defined to be a logical 1,1. When the first charge retaining transistor has a threshold voltage level of the erased threshold voltage level and the second charge retaining transistor has a threshold voltage level of the first programmed state, the second data state is defined to be a logical 0,1. When the first and second charge retaining transistors each have a threshold voltage level of the first programmed state, the third data state is defined to be a logical 1,0. When the first charge retaining transistor has a threshold voltage level of the erased threshold voltage level and the second charge retaining transistor has a threshold voltage level of a second programmed threshold voltage level, the fourth data state is defined to be a logical 0,0. In other embodiments, the data states may have other logical designation.

For embodiments where the charge retaining transistors are N-channel devices, the first programmed threshold voltage level is a positive value of from approximately +0.75V to approximately +1.25V (nominally +1.0V). The second programmed threshold voltage level is a positive value of at least +5.0V. For embodiments where the charge retaining transistors are P-channel devices, the first programmed threshold voltage level is a negative value of from approximately −0.75V to approximately −1.25V (nominally −1.0V). The second programmed threshold is a positive value of at least −5.0V.

In other embodiments, a block of an array of the NOR flash memory cells is arranged in rows and columns. The block forms a sub-array of the array of NOR flash memory cells. Each of the NAND-like dual charge retaining transistor NOR flash memory cells is formed of two serially connected charge retaining transistors. A first drain/source of a first of the two charge retaining transistors connected to a local bit line. A second drain/source of the first charge retaining transistor and a first drain/source of the second charge retaining transistor are solely connected together. A second source/drain of a second of the two charge retaining transistors connected to a local source line.

The local bit lines are each connected to a global bit line through a bit line gating transistor and the local source line are each connected to a global source line through a source line gating transistor. The control gates of each of the first charge retaining transistors on each row of NOR flash memory cells are connected to a word line. The control gates of the second charge retaining transistors on the row of NOR flash memory cells are connected to a separate word line. Each row of the NAND-like dual charge retaining transistor NOR flash memory cells forms a paired word line page.

Multiple blocks of the NAND-like dual charge retaining transistor NOR flash memory cells are arranged to form a sector of the array of NAND-like dual charge retaining transistor NOR flash memory cells. Multiple sectors of the NAND-like dual charge retaining transistor NOR flash memory cells are further arranged to form the array of the NAND-like dual charge retaining transistor NOR flash memory cells.

An erasure operation to remove data from the array of NAND-like dual charge retaining transistor NOR flash memory cells may be for single paired word line page, an entire block, an entire sector, or the entire array of NAND-like dual charge retaining transistor NOR flash memory cells. An erasure operation for a single paired word line page of the NAND-like dual charge retaining transistor NOR flash memory cells begins by connecting an isolated diffusion well containing a block of the NAND-like dual charge retaining transistor NOR flash memory cells to have a very large erase voltage of approximately +20.0V applied to the bulk regions of the single paired word line page of NAND-like dual charge retaining transistor NOR flash memory cells.

Coupling the very large erase voltage from the isolated implant well to the word lines of the unselected single paired word line pages of the NAND-like dual charge retaining transistor NOR flash memory cells. The very large erase voltage is transferred from the isolated implant well to the local bit lines, and the local source lines. The ground reference voltage level applied to the word lines of the selected single paired word line page of NAND-like dual charge retaining transistor NOR flash memory cells.

The erase of the single paired word line page of NAND-like dual charge retaining transistor NOR flash memory cells is then verified that it has been erased. In the erase verification operation, the word lines of the single paired word line page are set to the ground reference voltage level. The source line gating transistors and the bit line gating transistors are turned on and a read/verify voltage level is applied the local source lines. The local bit lines are pre-discharged to the voltage level of the ground reference voltage source. If the selected charge retaining transistors of the single paired word line page of the NAND-like dual charge retaining transistor NOR flash memory cells are adequately discharged, the local bit line will be set to the verify voltage level. If the selected charge retaining transistors of the single paired word line page are not sufficiently erased, the local bit lines having the insufficiently erased transistors will remain at the ground reference voltage level. The charge retaining transistors that have not been sufficiently erased are erase repetitively until their threshold voltage level is equal to or less than the erase state voltage level.

An erasure operation for a block of the NAND-like dual charge retaining transistor NOR flash memory cells begins by pre-programming and pre-program verifying a first row of each of the paired word line pages of the NAND-like dual charge retaining transistor NOR flash memory cells to the first threshold voltage level. To pre-program the block, a very large program voltage level is applied all the first word lines of the paired word line page of NAND-like dual charge retaining transistor NOR flash memory cells of the selected block to pre-program all the first charge retaining transistors of the paired word line page of NAND-like dual charge retaining transistor NOR flash memory cells to the first programmed threshold voltage level. The ground reference voltage level is applied to the second word lines of the paired word line page of NAND-like dual charge retaining transistor NOR flash memory cells of the selected block to inhibit programming of the second charge retaining transistors of the paired word line page of NAND-like dual charge retaining transistor NOR flash memory cells of the selected block. A verify voltage level of approximately Vt1L is applied to the first word line of the paired word line pages of NAND-like dual charge retaining transistor NOR flash memory cells of the selected block and a pass voltage level of greater than 6.0V is applied to the second word line of the paired word line page of NAND-like dual charge retaining transistor NOR flash memory cells of the selected block. The source line gating transistors and the bit line gating transistors are turned on and a ground reference voltage level is applied the local source lines. The local bit lines are pre-charged to the voltage level of the power supply voltage source less a transistor threshold voltage source (VDD-Vt). If the selected charge retaining transistors of the paired word line pages of the NAND-like dual charge retaining transistor NOR flash memory cells are adequately programmed to the first threshold voltage level, the local bit line will be set to the verify biasing voltage level. If the selected charge retaining transistors of the paired word line pages are not programmed to the first programmed threshold voltage level, the local bit lines having the insufficiently programmed transistors will be discharged to the ground reference voltage level. The charge retaining transistors that have not been sufficiently programmed are re-programmed repetitively until their threshold voltage level is equal to or greater than the first programmed threshold voltage level.

At the completion of the pre-programming of the charge retaining transistors connected to the first word line, the erasure operation continues by connecting an isolated implant well containing a block of the NAND-like dual charge retaining transistor NOR flash memory cells to have a very large erase voltage applied to the bulk regions of the paired word line pages of NAND-like dual charge retaining transistor NOR flash memory cells. Coupling the very large erase voltage from the isolated implant well to the word lines of the unselected paired word line pages of the NAND-like dual charge retaining transistor NOR flash memory cells of other blocks residing in the common isolated implant well. The very large erase voltage is coupled to a first of the word lines of the selected paired word line pages of NAND-like dual charge retaining transistor NOR flash memory cells of the selected block. The very large erase voltage is transferred from the isolated implant well to the local bit lines, and the local source lines. The ground reference voltage level applied to a second of the word lines of the selected paired word line pages of NAND-like dual charge retaining transistor NOR flash memory cells of the selected block. The very large erase voltage is from approximately +18.0V to approximately 22.0V (nominally +20.0V).

The erase of the selected block, sector or chip of NAND-like dual charge retaining transistor NOR flash memory cells is then verified that it has been erased. In the erase verification operation, the unselected word lines of the paired word line pages are set to the ground reference voltage level. The second word line of the paired word line page of NAND-like dual charge retaining transistor NOR flash memory cells is set to the ground reference voltage level. The pass voltage level of approximately +4.5V is applied to the first word line of the paired word line page of NAND-like dual charge retaining transistor NOR flash memory cells. The source line gating transistors and the bit line gating transistors are turned on and a verify biasing voltage level of approximately +1.0V is applied the local source lines. The local bit lines are pre-discharged to the voltage level of the ground reference voltage source. If the selected charge retaining transistors of the single paired word line page of the NAND-like dual charge retaining transistor NOR flash memory cells are adequately erased, the local bit line will be set to the verify biasing voltage level. If the selected charge retaining transistors of the single paired word line page are not sufficiently erased, the local bit lines having the insufficiently erased transistors will remain at the ground reference voltage level. The charge retaining transistors that have not been sufficiently erased are erase repetitively until their threshold voltage level is equal to or less than the erase state voltage level.

The charge retaining transistors of each of the paired word lines of NAND-like dual charge retaining transistor NOR flash memory cells are programmed to adjust the threshold voltages of the charge retaining transistors. The NAND-like dual charge retaining transistor NOR flash memory cells have three threshold voltage levels that are designated to define the data states retained by each of the NAND-like dual charge retaining transistor NOR flash memory cells on each of the paired word line page of NAND-like dual charge retaining transistor NOR flash memory cells. In some embodiments, when the first charge retaining transistor has a threshold voltage level of the first programmed state and the second charge retaining transistor has a threshold voltage level of the erased threshold voltage level, the data state is defined to be a logical 1,1. When the first charge retaining transistor has a threshold voltage level of the erased threshold voltage level and the second charge retaining transistor has a threshold voltage level of the first programmed state, the data state is defined to be a logical 0,1. When the first and second charge retaining transistors each have a threshold voltage level of the first programmed state, the data state is defined to be a logical 1,0. When the first charge retaining transistor has a threshold voltage level of the erased threshold voltage level and the second charge retaining transistor has a threshold voltage level of a second programmed state, the data state is defined to be a logical 0,0. In other embodiments, the data states may have other logical designations.

For embodiments where the charge retaining transistors are N-channel devices, the first programmed state is a positive value of from approximately +0.75V to approximately +1.25V (nominally +1.0V). The second programmed state is a positive value of at least +5.0V. The erased threshold voltage level is at least approximately −1.8V. For embodiments where the charge retaining transistors are P-channel devices, the first programmed state is a negative value of from approximately −0.75V to approximately −1.25V (nominally −1.0V). The second programmed state is a positive value of at least −5.0V. The erased threshold voltage level is at least approximately +1.8V.

A program operation to program the charge retaining transistors of each paired word line page of NAND-like dual charge retaining transistor NOR flash memory cells begins by erasing the charge retaining transistors of the selected paired word line page of NAND-like dual charge retaining transistor NOR flash memory cells. Erasing the selected paired word line page of NAND-like dual charge retaining transistor NOR flash memory cells sets the threshold voltage to the erased threshold voltage level for all the charge retaining transistors of the selected paired word line page of NAND-like dual charge retaining transistor NOR flash memory cells. Selected charge retaining transistors connected to the first word line of the selected paired word line page of NAND-like dual charge retaining transistor NOR flash memory cells are programmed to have a threshold voltage level of the first programmed threshold voltage level. The unselected charge transistors of the first word line of the paired word line page of NAND-like dual charge retaining transistor NOR flash memory cells have a threshold voltage level that is the erased threshold voltage level. Next, selected charge retaining transistors connected to the second word line of the selected paired word line page of NAND-like dual charge retaining transistor NOR flash memory cells are programmed to the first programmed threshold voltage level. Those of the selected charge retaining transistors connected to the second word line of the selected paired word line page of NAND-like dual charge retaining transistor NOR flash memory cells are then programmed from the first programmed threshold voltage level to the second programmed threshold voltage level.

To program the selected charge retaining transistors of the selected paired word line page of NAND-like dual charge retaining transistor NOR flash memory cells, a very large program voltage of from approximately +15.0 V to approximately −20.0V is applied the word line connected to the selected charge retaining transistors. The unselected charge retaining transistors connected to the unselected paired word line pages of the NAND-like dual charge retaining transistor NOR flash memory cells have a pass voltage level of approximately +4.5V applied to them. The bit line select transistors and the source line select transistors are activated to transfer a ground reference voltage level to the local bit lines and the local source lines and thus to the source/drains of the first and second charge retaining transistors of the selected paired word line page of NAND-like dual charge retaining transistor NOR flash memory cells. A program inhibit voltage of approximately 8.0V is applied to the local source lines and local bit lines connected to the charge retaining transistors of the selected paired word line page of NAND-like dual charge retaining transistor NOR flash memory cells that are to have a threshold voltage level of the erased threshold voltage level. The selected paired word line page of NAND-like dual charge retaining transistor NOR flash memory cells is program verified to validate that the selected charge transistors that are to have a threshold voltage level of the first programmed threshold voltage level are correctly programmed. If the selected charge transistors do not have their threshold voltage level at the first programmed threshold voltage level, they are iteratively reprogrammed until they have achieved the correct threshold voltage level.

Those charge retaining transistor connected to the second word line of the selected paired word line page of NAND-like dual charge retaining transistor NOR flash memory cells that are to programmed to the second programmed threshold voltage level, the very large program voltage level is applied to the second word line of the selected paired word line page of NAND-like dual charge retaining transistor NOR flash memory cells. The pass voltage level is applied to the unselected word lines. The source line select transistors and the bit line select transistors are activated to transfer the ground reference voltage level to the local source lines and the local bit lines connected to the selected charge retaining transistors that are to be programmed to the second threshold voltage level. The program inhibit voltage level is applied to those local source lines and the local bit lines that connected to the charge transistors that are to remain at the erased threshold voltage level or the first programmed threshold voltage level. The selected paired word line page of NAND-like dual charge retaining transistor NOR flash memory cells is program verified to validate that the selected charge transistors that are to have a threshold voltage level of the second programmed threshold voltage level are correctly programmed. If the selected charge transistors do not have their threshold voltage level at the second programmed threshold voltage level, they are iteratively reprogrammed until they have achieved the correct threshold voltage level.

The program verify operation begins by applying the pass voltage level to the unselected word line of the paired word line page of NAND-like dual charge retaining transistor NOR flash memory cells. A read/verify voltage that is the lower limit of the first programmed threshold voltage level is applied to the selected word line of the paired word line page of NAND-like dual charge retaining transistor NOR flash memory cells. The source line gating transistors and the bit line gating transistors are turned on and a program verify voltage level of approximately the ground reference voltage level is applied the local source lines. The local bit lines are pre-charged to the voltage level of the power supply voltage source less a transistor threshold (VDD-Vt). If the selected charge retaining transistors of the single paired word line page of the NAND-like dual charge retaining transistor NOR flash memory cells are adequately programmed, the local bit line will be set to the read/verify voltage level. If the selected charge retaining transistors of the single paired word line page are not sufficiently programmed, the local bit lines having the insufficiently programmed transistors will be discharged to the ground reference voltage level. The charge retaining transistors that have not been sufficiently programmed are programmed repetitively until their threshold voltage level is correctly programmed. For verifying the charge retaining transistors that are programmed to the second threshold voltage level, a lower limit of the second programmed threshold voltage level is applied to the second word line of the paired word line page of NAND-like dual charge retaining transistor NOR flash memory cells.

A read operation to read the data state of selected NAND-like dual charge retaining transistor NOR flash memory cells selected second word line of the paired word line page of NAND-like dual charge retaining transistor NOR flash memory cells begins by applying the ground voltage level to the word lines connected to the unselected NAND-like dual charge retaining transistor NOR flash memory cells and pass voltage to a first of the word line of the selected NAND-like dual charge retaining transistor NOR flash memory cells. A read reference voltage of approximately 2.7V is applied to the second word line connected to the selected NAND-like dual charge retaining transistor NOR flash memory cells. The source line gating transistors and the bit line gating transistors are turned on and a read biasing voltage level of approximately +1.0V is applied the local bit lines. The local source lines are set to the voltage level of the ground reference voltage source. A cell current is compared to a first reference current and a second reference current to determine an internal data state of the second charge retaining transistors of the selected charge retaining transistors. The read operation to read the data state of selected NAND-like dual charge retaining transistor NOR flash memory cells of the first word line of the paired word line page of NAND-like dual charge retaining transistor NOR flash memory cells begins by applying the ground voltage level remains applied to the word lines connected to the unselected NAND-like dual charge retaining transistor NOR flash memory cells and pass voltage is then applied to the second word line of the selected NAND-like dual charge retaining transistor NOR flash memory cells. A read reference voltage of approximately 2.7V is applied to first word line connected to the selected NAND-like dual charge retaining transistor NOR flash memory cells. The source line gating transistors and the bit line gating transistors are turned on and the read biasing voltage level of approximately +1.0V is applied the local bit lines. The local source lines are set to the voltage level of the ground reference voltage source. The cell current is compared to the first reference current and the second reference current to determine a data state of the second charge retaining transistors of the selected charge retaining transistors. The internal data states of the first and second charge retaining transistors are encoded to determine an external program data state of the selected NAND-like dual charge retaining transistor NOR flash memory cells.

BRIEF DESCRIPTION OF THE DRAWINGS

FIGS. 4*a* and 4*b* are tables describing the threshold voltage levels defining the internal data states of the paired word line page of NAND-like dual charge retaining transistor NOR flash memory cells and the encoding to define the external program data states that embody the principles of this invention.

FIG. 10 is a table of the voltage levels applied to the terminals of an array of NAND-like dual charge retaining transistor NOR flash memory cells for an erase operation and an erase verify operation embodying the principles of this invention.

FIG. 11 is a table of the voltage levels applied to the terminals of an array of NAND-like dual charge retaining transistor NOR flash memory cells for a pre-programming operation embodying the principles of this invention.

FIG. 13 is a table of the voltage levels applied to the terminals of an array of NAND-like dual charge retaining transistor NOR flash memory cells for a program operation and a program verify operation embodying the principles of this invention.

FIG. 15 is a table of the voltage levels applied to the terminals of an array of NAND-like dual charge retaining transistor NOR flash memory cells for a read operation embodying the principles of this invention.

DETAILED DESCRIPTION OF THE INVENTION

As described above, over-erasure occurs if, during the erasing step, too many electrons are removed from the floating gate leaving a slight positive charge. This biases the dual floating gate transistor NOR flash memory cell to be conducting such that a current may leak through the dual floating gate transistor NOR flash memory cell even when it is not addressed. To prevent the effects of over-erasing in an array of the NAND-like dual charge retaining (charge storage in a floating gate or charge trapping in a SONOS (silicon-oxide-nitride-oxide silicon)) transistor NOR flash memory cells, erasure of a paired word line page of NAND-like dual charge retaining transistor NOR flash memory cells is accomplished by erasing, verifying over-erasing. The threshold voltage level of the erased charge retaining transistors is an erased threshold voltage level where the charge retaining transistors have a leakage current. The method progresses by programming one of two charge retaining transistors of the NAND-like dual charge retaining transistor NOR flash memory cells to a first programmed threshold voltage level, and program verifying the dual charge retaining transistor NOR flash memory cells. If a first charge retaining transistor is programmed to the first programmed threshold voltage level and a second charge retaining transistor remains at the erase threshold voltage level, the paired word line page of NAND-like dual charge retaining transistor NOR flash memory cell is designated to be retaining a first internal data state. If the first charge retaining transistors remains at the erase threshold voltage level and the second charge retaining transistor is programmed to the first programmed threshold voltage level, the paired word line page of NAND-like dual charge retaining transistor NOR flash memory cell is designated to be retaining a second internal data state.

The method progresses by programming the other of the two charge retaining transistors of the NAND-like dual charge retaining transistor NOR flash memory cells to the first programmed threshold voltage level or to a second programmed threshold voltage level, and program verifying the dual charge retaining transistor NOR flash memory cells. If a first charge retaining transistor is programmed to the first programmed threshold voltage level and the second charge retaining transistor is then programmed to the first programmed threshold voltage level the paired word line page of NAND-like dual charge retaining transistor NOR flash memory cell is designated to be retaining a third internal data state. If the first charge retaining transistors remains at the erase threshold voltage level, the second charge retaining transistor is further programmed to the second programmed threshold voltage level. The paired word line page of NAND-like dual charge retaining transistor NOR flash memory cell is designated to be retaining a fourth internal data state.

Figure 1A:
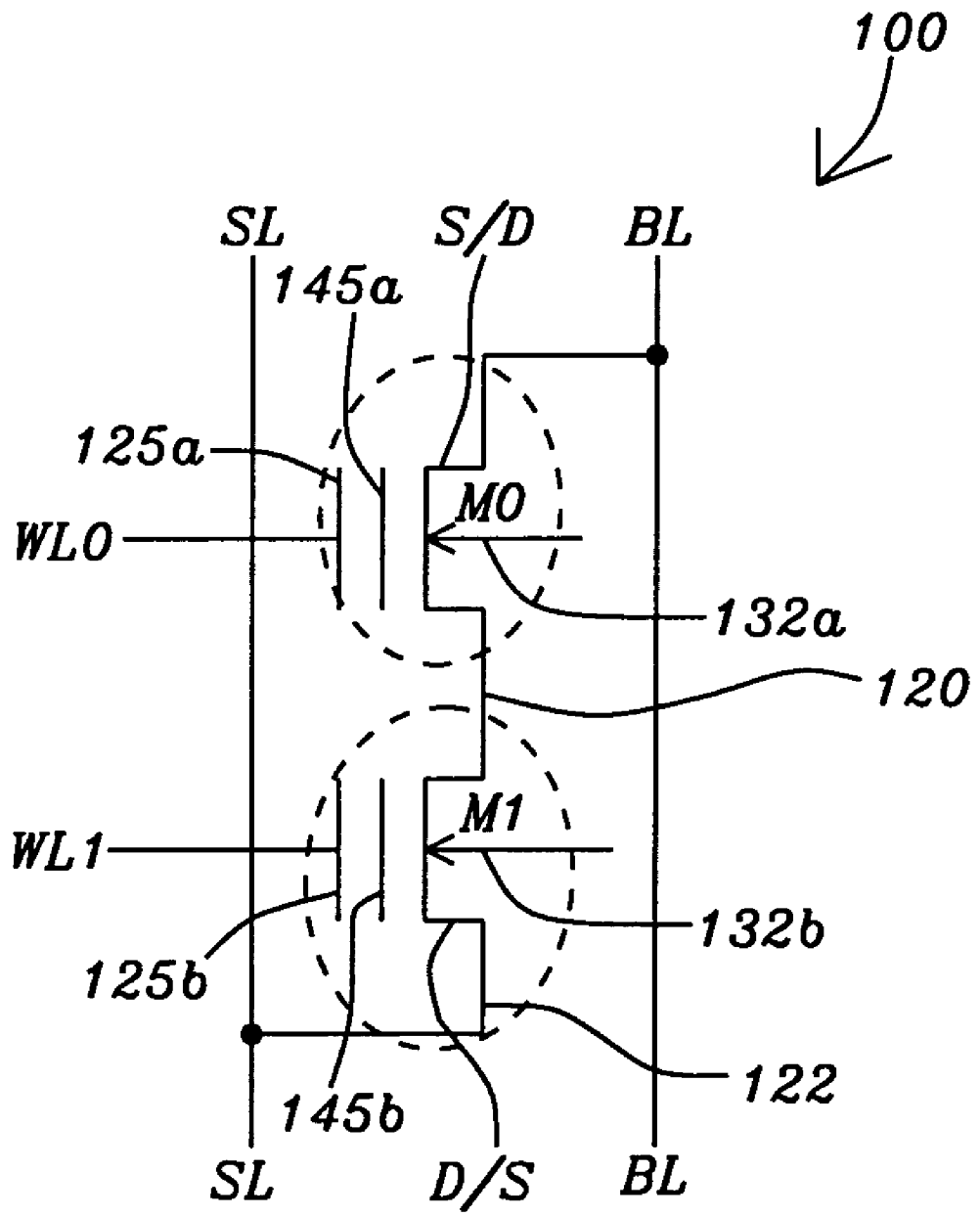
FIG. 1*a* is schematic diagram of an embodiment of dual floating gate transistor NOR flash memory cell embodying the principles of the present invention.
Figures 1, 1B, 2:
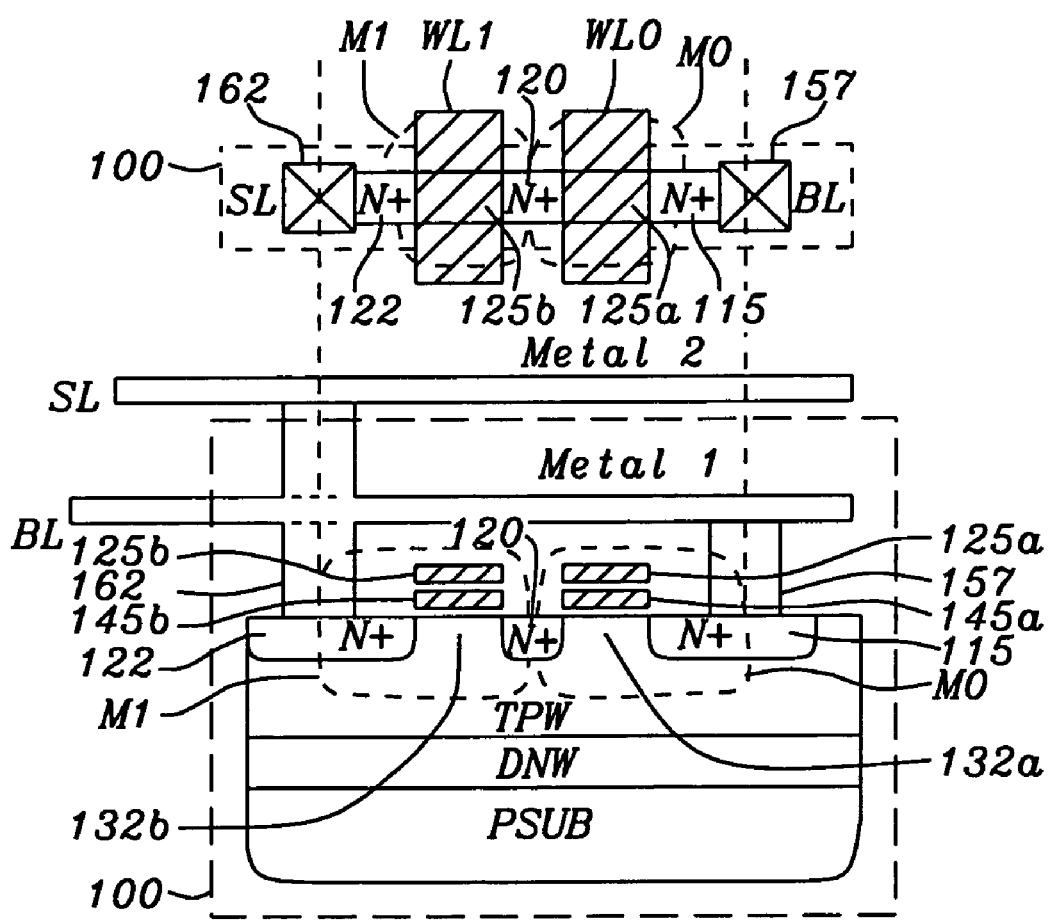
FIGS. 1*b*-1 and 1*b*-2 are top plan views and cross sectional cross sectional views of an embodiment of dual floating gate transistor NOR flash memory cell embodying the principles of the present invention.

FIG. 1a is the schematic diagram of a NAND-like dual floating gate transistor NOR flash memory cell 100 embodying the principles of the present invention. FIGS. 1b-1 is a top plan view of an implementation of a dual floating gate transistor NOR flash memory cell 100 embodying the principles of the present invention. FIGS. 1b-2 is a cross sectional view of an implementation of a dual floating gate transistor NOR flash memory cell 100 embodying the principles of the present invention. The dual floating gate transistor NOR flash cell 100 is formed in the top surface of a P-type substrate p-SUB. An N-type material is diffused into the surface of the P-type substrate p-SUB to form a deep n-type diffusion well DNW. A P-type material is then diffused into the surface of the deep n-type diffusion well DNW to form a shallow p-type diffusion well TPW (commonly referred to as a triple P-well). The N-type material is then diffused into the surface of the shallow p-type diffusion well TPW to form the drain/source region (D) 115 of the floating gate transistor M0, the source/drain region 122 of the floating gate transistor M1 and the common source/drain (S/D) 120. The common source/drain 120 is structure to provide the sole connection of the source region of the floating gate transistor M0 and the drain of the floating gate transistors M1. A first polycrystalline silicon layer is formed above the bulk region of the shallow p-type diffusion well TPW between the drain/source region 115 and the common source/drain region 120 floating gate transistor M0 and the common source/drain region 120 and the source/drain region 122 of the floating gate transistor M1 to form the floating gates 145a and 145b. A second polycrystalline silicon layer is formed over the floating gates 145a and 145b to create the control gates (G) 125a and 125b of the floating gate transistors M0 and M1. The common source/drain region 120 is formed as self-aligned between the two adjacent second polycrystalline silicon layers of two control gates 125a and 125b of floating gate transistors M0 and M1. The common source/drain 120 is used in the floating gate transistors M0 and M1 to reduce the source line pitch.

The gate length of the floating gate transistors M0 and M1 is the channel region in the bulk region of shallow P-type well TPW between drain/source region 115 and the common source/drain region 120 of the floating gate transistor M0 and the common source/drain region 120 and the source/drain region 122 of the floating gate transistors M0 and M1. The width of the channel region 132a and 132b of the NOR floating gate transistors 125a and 125b is determined by the width of the N-diffusion of the drain/source region 115, the source/drain region 122 and the common source/drain region 120. The typical unit size of the dual floating gate transistor NOR flash memory cell 100 is from approximately $12\lambda^2$ to approximately $15\lambda^2$. Therefore the effective size for a single bit NOR cell is approximately $6\lambda^2$. The effective size ($6\lambda^2$) of a single bit NOR cell is slightly larger than a NAND cell size of the prior art. However, the effective size of a single bit NOR cell is much smaller than the NOR cell size ($10\lambda^2$) of the prior art for a semiconductor manufacturing process above 50 nm.

The NOR cell structure of the prior art is projected to increase to $15\lambda^2$ due to the scalability issues in semiconductor manufacturing process below 50 nm. The effective single bit/single transistor size of the dual floating gate transistor NOR flash memory cell 100 remains constant an effective cell size of approximately $6\lambda^2$. The constant cell size is a result of the scalability is identical to that of the NAND flash memory cell of the prior art.

The floating gate layers 145a and 145b each respectively store electron charges to modify the threshold voltage of the floating gate transistors M0 and M1. In all operations such as read, program and erase, the P-type substrate p-SUB is always connected to a ground reference voltage source (GND). The deep n-type diffusion well DNW is connected to the power supply voltage source (VDD) in read and program operations but is connected to a very large erase voltage level of from approximately +18.0V to approximately 22.0V (nominally +20.0V) in a Fowler-Nordheim channel erase operation. The shallow P-type well TPW is connected to the ground reference voltage in normal read and program operations but is connected to the very large erase voltage level in the Fowler Nordheim channel erase operation. The deep n-type diffusion well DNW and the shallow p-type diffusion well TPW are biased commonly to the very large erase voltage level to avoid the undesired forward current. In present designs of dual floating gate transistor NOR flash memory cell 100, the power supply voltage source is either 1.8V or 3.0V.

In an array of dual floating gate transistor NOR flash memory cells 100, the floating gate transistors M0 and M1 are arranged in rows and columns. The second polycrystalline silicon layer 125 that is the control gate of the floating gate transistors M0 and M1 and is extended to form a word-line WL that connects to each of the floating gate transistors M0 and M1 on a row of the array. The drain/source 115 of the floating gate transistors M0 and M1 is connected to a bit line BL. The source/drain 122 of the floating gate transistor M1 is connected to a source line SL. The bit line BL and the source line SL being formed in parallel and in parallel with a column of the floating gate transistors M0 and M1

A tunnel oxide is formed on top of the channel region 132a and 132b between the drain/source region 115 and the common source/drain region 120 of the floating gate transistor M0 and between the common source/drain region 120 and the source/drain region 122 of the floating gate transistor M1 and beneath the floating gates 145a and 145b. The thickness of the tunnel oxide is typically 100 Å. The tunnel oxide is the layer through which the electron charges pass during the Fowler-Nordheim channel tunneling programming and erasing. During a programming operation, the Fowler-Nordheim tunnel programming attracts electrons to the floating gates 145a and 145b through the tunnel oxide from cell's channel regions 132a and 132b within the shallow p-type diffusion well TPW. During an erasing operation, the Fowler-Nordheim tunnel erasing expels stored electrons from the floating gates 145a and 145b through the tunnel oxide to cell's channel regions 132a and 132b and thus into the shallow p-type diffusion well TPW.

After an erase operation, fewer electron charges are stored in the floating gates 145a and 145b that results in a decrease in an erased threshold voltage level (Vt0) of the floating gate transistors M0 and M1. In contrast, in a Fowler-Nordheim program operation, electrons are attracted into floating gates 145a and 145b so that a first programmed threshold voltage level (Vt1) and a second programmed threshold voltage level of the floating gate transistors M0 and M1 is produced by applying a to the very large programming voltage level of from approximately 15.0V to approximately 20.0V to the control gates 125a and 125b of the floating gates 145a and 145b.

Figure 2A:
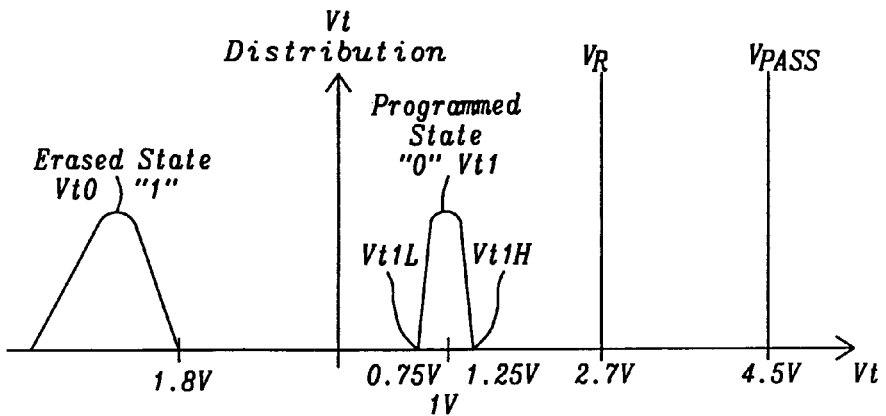
FIG. 2*a* is a graph of threshold voltage levels for a first floating gate transistor of the dual floating gate transistor NOR flash memory cell embodying the principles of the present invention.
Figure 2B:
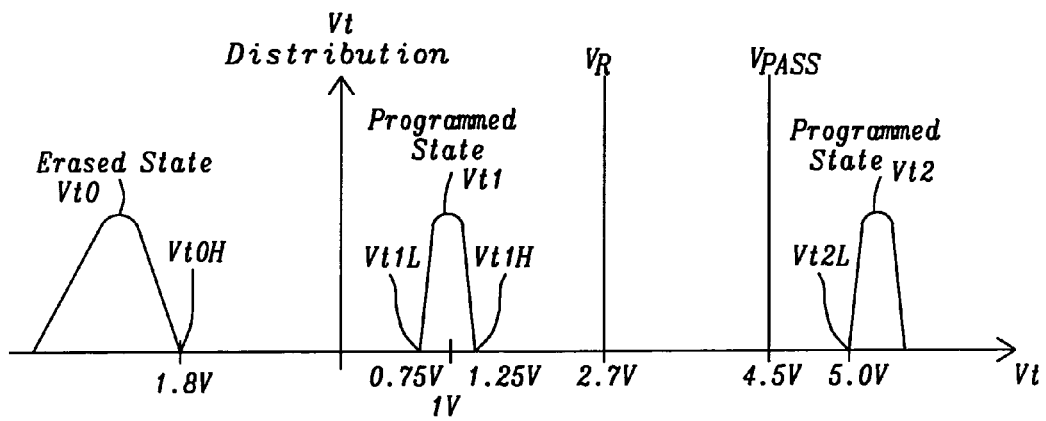
FIG. 2*b* is a graph of threshold voltage levels for a second floating gate transistor of the dual floating gate transistor NOR flash memory cell embodying the principles of the present invention.

FIG. 2a is a graph of threshold voltage levels for a first floating gate transistor M0 of the dual floating gate transistor NOR flash memory cell 100. FIG. 2b is a graph of threshold voltage levels for a second floating gate transistor M1 of the dual floating gate transistor NOR flash memory cell 100. Referring now to FIGS. 2a and 2b, the erased state Vt0 illustrates the distribution of the two floating gate transistors M0 and M1 that have their threshold voltage levels reduced to a voltage level less than an upper limit of the erased threshold voltage level Vt0L or approximately −1.8V. If the two floating gate transistors M0 and M1 have their threshold voltage in this region, they may be in a marginally conductive state during a read operation to cause corruption of the data during a read operation due to the leakage current. To prevent this, one or both of floating gate transistors M0 and M1 are programmed to the first programmed threshold level (Vt1). The first programmed threshold voltage level (Vt1) is nominally +1.0V with a lower voltage limit VT1L of approximately +0.75V and an upper voltage limit Vt0H of approximately +1.25V. The second floating gate transistor M1 may be programmed to a second programmed threshold voltage level (Vt2). The second programmed threshold voltage level (Vt2) is a voltage that is greater than the lower limit of the second programmed threshold voltage level (Vt2L) +5.0V.

During the reading operation, the control gate 125a or 125b of the selected floating gate transistor M0 or M1 has a read reference voltage level (VR) applied to it and the unselected floating gate transistor M0 or M1 functions as pass gate transistor and has pass voltage level (Vpass) applied to it. Other unselected NAND-like dual floating gate transistor NOR flash memory cells 100 have the ground reference voltage level applied to them to block any leakage for an accurate reading. The read reference voltage level VR has a voltage level that is approximately 2.7V. The read reference voltage level VR is greater than the upper limit of the erased threshold voltage level Vt0H of the selected floating gate transistor M0 or M1 by approximately 4.5V. The unselected floating gate transistor M0 or M1 of the selected NAND-like dual floating gate transistor NOR flash memory cell 100 has a pass voltage level Vpass that is approximately +4.5V. Since the power supply voltage source VDD could be from approximately +1.6V to approximately +1.8V or from +2.7V to approximately +3.6V. For the lower of the ranges of the power supply voltage source VDD the read reference voltage level VR must to be pumped, but not for the larger range of the power supply voltage VDD. This results in achieving a low series resistance with sufficiently high current for the high speed application.

Figure 3:
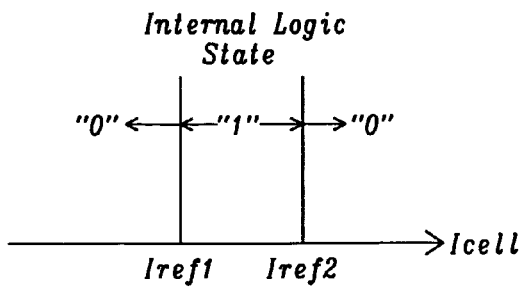
FIG. 3 is a plot illustrating the internal data state definitions for the paired word line page of NAND-like dual charge retaining transistor NOR flash memory cells embodying the principles of this invention.

FIG. 3 is a plot illustrating the internal data state definitions for embodiments of the paired word line page of NAND-like dual floating gate transistor NOR flash memory cells 100. The magnitude of the read reference voltage level VR and the pass voltage level VPASS are set such that the erased threshold voltage level, the first programmed threshold voltage level, and the second threshold voltage level will cause a cell current Icell to have a particular level dependent on the threshold voltage level to which floating gate transistor M0 or M1 are coded. The first reference current Iref1 and the second reference current Iref2 are reference currents employed by read sense amplifiers (discussed in more detail hereinafter) connected to the source lines of an array of the NAND-like dual floating gate transistor NOR flash memory cells 100.

FIGS. 4a and 4b are tables describing the threshold voltage levels defining the internal data states for the floating gate transistors of the NAND-like dual floating gate transistor NOR flash memory cells 100 and the encoding to define the external program data states. As is known in the art the drain current (id) of a metal oxide semiconductor (MOS) transistor is proportional to the difference between the gate to source voltage (Vgs) and the threshold voltage level (Vt). The first column of table of FIG. 4 illustrates the combinations the threshold voltage levels for the floating gate transistors M0 and M1. The second column shows the calculations for the difference between the gate to source voltage (Vgs) and the threshold voltage level (Vt) for floating gate transistor M0 and the third column shows the calculations for the difference between the gate to source voltage (Vgs) and the threshold voltage level (Vt) for floating gate transistor M1. Since this difference is proportional to the drain current, which in this case is the cell current Icell, the combinations of the magnitudes of the gate to source voltage (Vgs) and the threshold voltage (Vt) differences are used to determine the cell current Icell.

The first four data rows determine the cell current for reading the first floating gate transistor M0. The read reference voltage level VR is applied to the first word line WL0 and thus to the control gate 125a of the first floating gate transistor M0. The pass voltage level VPASS is applied to the second word line WL1 and thus to the control gate 125b of the second floating gate transistor M1. The differences between the gate to source voltage Vgs1 and the threshold voltage $Vt_{M0}$ for the first floating gate transistor M0 is shown in the second column and the differences between the gate to source voltage Vgs2 and the threshold voltage $Vt_{M1}$ for the second floating gate transistor M1 is shown in the third column. The cell current as developed from the application of the read reference voltage level VR and the pass voltage level VPASS to the control gate 125a and 125b result in the cell current Icell flowing through the NAND-like dual floating gate transistor NOR flash memory cells 100. With the floating gate transistors M0 and M1 respectively having a threshold voltage of the first programmed threshold voltage level Vt1 and the erased threshold voltage level Vt0, the cell current Icell has a magnitude that is greater than the first reference current level Iref1 and less than the second reference current level Iref2. The internal data state is assigned the logical value of "1" for the first floating gate transistor M0. With the floating gate transistors M0 and M1 respectively having a threshold voltage of the erased threshold voltage level Vt0 and the first programmed threshold voltage level Vt1, the cell current Icell has a magnitude that is greater than the second reference current level Iref2. The internal data state is assigned the logical value of "0" for the first floating gate transistor M0. With the floating gate transistors M0 and M1 both having a threshold voltage of the first programmed threshold voltage level Vt1, the cell current Icell has a magnitude that is greater than the first reference current level Iref1 and less than the second reference current level Iref2. The internal data state is assigned the logical value of "1" for the first floating gate transistor M0. With the floating gate transistors M0 and M1 respectively having a threshold voltage of the erased threshold voltage level Vt0 and the second programmed threshold voltage level Vt2, the NAND-like dual floating gate transistor NOR flash memory cell 100 has no cell current Icell. The internal data state is assigned the logical value of "0" for the first floating gate transistor M0.

The second four data rows determine the cell current for reading the second floating gate transistor M1. The pass voltage level VPASS is applied to the first word line WL0 and thus to the control gate 125a of the first floating gate transistor M0. The read reference voltage level VR is applied to the second word line WL1 and thus to the control gate 125b of the second floating gate transistor M1. The differences between the gate to source voltage Vgs1 and the threshold voltage $Vt_{M0}$ for the first floating gate transistor M0 is shown in the second column and the differences between the gate to source voltage Vgs2 and the threshold voltage $Vt_{M1}$ for the second floating gate transistor M1 is shown in the third column. The cell current as developed from the application of the read reference voltage level VR and the pass voltage level VPASS to the control gate 125a and 125b result in the cell current Icell flowing through the NAND-like dual floating gate transistor NOR flash memory cells 100. With the floating gate transistors M0 and M1 respectively having a threshold voltage of the first programmed threshold voltage level Vt1 and the erased threshold voltage level Vt0, the cell current Icell has a magnitude that is greater than second reference current level Iref2. The internal data state is assigned the logical value of "0" for the first floating gate transistor M1. With the floating gate transistors M0 and M1 respectively having a threshold voltage of the erased threshold voltage level Vt0 and the first programmed threshold voltage level Vt1, the cell current Icell has a magnitude that is greater than the first reference current level Iref1 and less than the second reference current level Iref2. The internal data state is assigned the logical value of "1" for the first floating gate transistor M0. With the floating gate transistors M0 and M1 both having a threshold voltage of the first programmed threshold voltage level Vt1, the cell current Icell has a magnitude that is greater than the first reference current level Iref1 and less than the second reference current level Iref2. The internal data state is assigned the logical value of "1" for the first floating gate transistor M0. With the floating gate transistors M0 and M1 respectively having a threshold voltage of the erased threshold voltage level Vt0 and the second programmed threshold voltage level Vt2, the NAND-like dual floating gate transistor NOR flash memory cell 100 has no cell current Icell. The internal data state is assigned the logical value of "0" for the first floating gate transistor M0.

Referring now to FIG. 4b, the threshold voltages of the floating gate transistors M0 and M1 are established to be as shown in the first column. The internal logic states are transferred from FIG. 4a to form the second column. The external program data logic states are defined as shown in the third column. The programming mapping between the external program data logic states and the threshold voltage levels of the floating gate transistors M0 and M1 is defined in the fourth and fifth columns.

In case where the floating gate transistors M0 and M1 respectively have a threshold voltage of the first programmed threshold voltage level Vt1 and the erased threshold voltage level Vt0, the internal data state is assigned the logical value of (1,0) and the external program data state is defined as the logical value of (1,1) for the floating gate transistors M0 and M1. In the case where the floating gate transistors M0 and M1 respectively have a threshold voltage of the erased threshold voltage level Vt0 and the first programmed threshold voltage level Vt1, the internal data state is assigned the logical value of (0,1) an external program data state is define as the logical value (0,1) for the floating gate transistors M0 and M1. In the case where the floating gate transistors M0 and M1 both have a threshold voltage of the first programmed threshold voltage level Vt1, the internal data state is assigned the logical value of (1,1) and the external program data state is defined to have the logical value (1,0) for the floating gate transistors M0 and M1. In the case where the floating gate transistors M0 and M1 respectively have a threshold voltage of the erased threshold voltage level Vt0 and the second programmed threshold voltage level Vt2, the internal data state is assigned the logical value of (0,0) and the external program data state is defined to be the logical value of (0,0). To map the threshold voltage levels from the external program data logic states, the threshold value for the upper floating gate transistors M0 is determined as VtM0=NOT B'1. That is, if the external program data state B'1 is a logical "1", the threshold voltage level of the upper floating gate transistor M0 is the first programmed threshold voltage level Vt1. Alternately if external program data state B'1 is the logical state "0", the upper floating gate transistor M0 is the erased threshold voltage level. If the threshold voltage level of the lower floating gate transistors M1 is to be the erased threshold voltage level Vt0, the threshold value for the lower floating gate transistors M1 is determined as VtM1=B'0 AND B'1. That is, if the external program data state B'0 and the external program data state B'1 are a logical "1", the threshold voltage level of the lower floating gate transistor M1 is the erased threshold voltage level Vt0. If the threshold voltage level of the lower floating gate transistors M1 is to be the first programmed threshold voltage level Vt1, the threshold value for the lower floating gate transistors M1 is determined as VtM1=B'0 XOR B'1. That is, if the external program data state B'0 and the external program data state B'1 are have different logical states ("1,0" or "0,1"), the threshold voltage level of the lower floating gate transistor M1 is the programmed to the first programmed threshold voltage level Vt1. If the threshold voltage level of the lower floating gate transistors M1 is to be the second programmed threshold voltage level Vt2, the threshold value for the lower floating gate transistors M1 is determined as VtM1=B'0 NOT OR B'1. That is, if the external program data state B'0 and the external program data state B'1 are have the logical state "0,0", the threshold voltage level of the lower floating gate transistor M1 is the programmed to the second programmed threshold voltage level Vt2.

Figure 5:
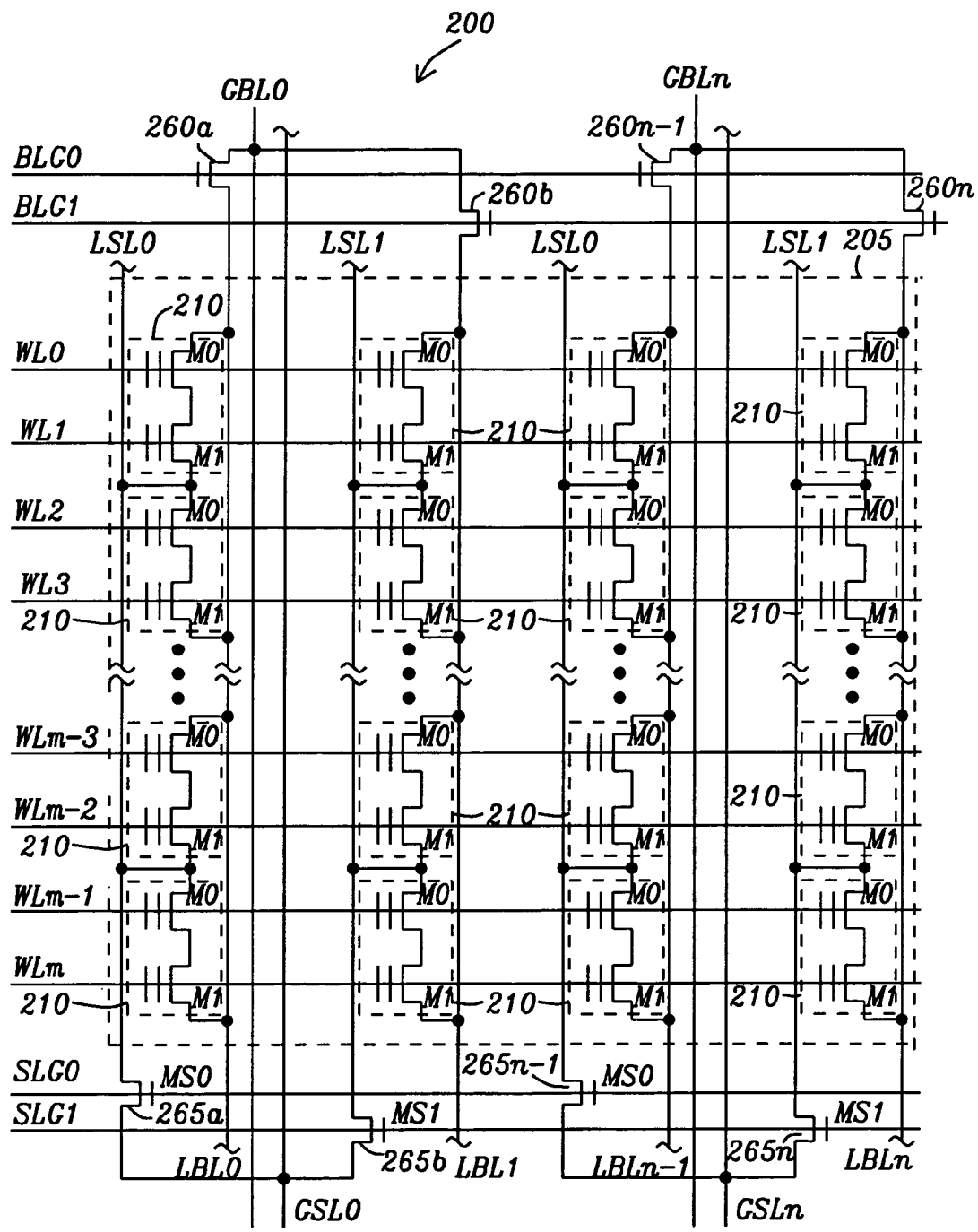
FIG. 5 is a schematic diagram of an array of the NAND-like dual charge retaining transistor NOR flash memory cells embodying the principles of this invention.

FIG. 5 is a schematic diagram of a NOR flash nonvolatile memory block 200 incorporating an array 205 of the NAND-like dual floating gate transistor NOR flash cells 210. The dual floating gate transistor NOR flash cells 210 of the array 205 of the NOR flash nonvolatile memory block 200 are arranged in a matrix of rows and columns. Each of the dual floating gate transistor NOR flash cells 210 includes two floating gate transistors M0 and M1. The two floating gate transistors M0 and M1 are structured and operate as the floating gate transistors M0 and M1 described above in FIGS. 1a, 1b-1, and 1b-2. The first source/drain of the floating gate transistor M0 is connected to one of the local bit lines LBL0, LBL1, . . . , LBLn–1, and LBLn. The second source/drain of the floating gate transistor M0 is solely connected to the first source/drain of the NOR floating gate transistor M1. The second source/drain of the floating gate transistor M1 is connected of one of the local source lines LSL0, LSL1, . . . , LSLn–1, and LSLn. Each of local bit lines LBL0, LBL1, . . . , LBLn–1, and LBLn and local source lines LSL0, LSL1, . . . , LSLn–1, and LSLn are arranged in parallel with a column of the array 205 of dual floating gate transistor NOR flash cells 210, The local bit lines LBL0, LBL1, . . . , LBLn–1, and LBLn and the local source lines LSL0, LSL1, . . . , LSLn–1, and LSLn are connected to the dual floating gate transistor NOR flash cells 210 such that the dual floating gate transistor NOR flash cells 210 are symmetrical.

The local bit lines LBL0, LBL1, . . . , LBLn–1, and LBLn associated with adjacent columns of the dual floating gate transistor NOR flash cells 210 are connected through the bit line select transistors 260a, . . . , 260n to the global bit lines GBL0, . . . , GBLn. The local source lines LSL0, LSL1, . . . , LSLn–1, and LSLn associated with adjacent columns of the dual floating gate transistor NOR flash cells 210 are connected through the source line select transistors 265a, . . . , 265n to the global source lines GSL0, . . . , GSLn.

Each of the control gates of the floating gate transistors M0 and M1 of the dual floating gate transistor NOR flash cells 210 on each row of the array 205 is connected to one of the word lines WL0, WL1, . . . , WLm–1, and WLm. The word lines WL0, WL1, . . . , WLm–1, and WLm that are connected to control gates of floating gates of the individual cells on one row of the dual floating gate transistor NOR flash cells 210 are paired to form a paired word line page of NAND-like dual floating gate transistor NOR flash memory cells 210.

Each of the gates of the bit line select transistors 260a, . . . , 260n is connected to receive the bit line select signals BLG0 and BLG1 for activation of the bit line select transistors 260a, . . . , 260n to connect a selected local bit lines LBL0, LBL1, . . . , LBLn–1, and LBLn to its associated global bit line GBL0, . . . , GBLn. Each of the gates of the source line select transistors 265a, . . . , 265n is connected to receive the source line select signals SLG0 and SLG1 for activation of the source line select transistors 265a, . . . , 265n to connect a selected local source lines LSL0, LSL1, . . . , LSLn–1, and LSLn to its associated global source line GSL0, GSL1, . . . , GSLn–1, and GSLn.

The array 205 of the NOR flash nonvolatile memory block 200 is further divided into paired word line pages of dual floating gate transistor NOR flash cells 210. Each of the two floating gate transistors M0 and M1 of the dual floating gate transistor NOR flash cells 210 on each pair of rows is assigned to one page of the two floating gate transistors M0 and M1. Since at least one of the two floating gate transistors M0 and M1 are programmed to have a positive threshold voltage for all the program states, over-erase is not a concern during over-erase verification.

Figure 6:
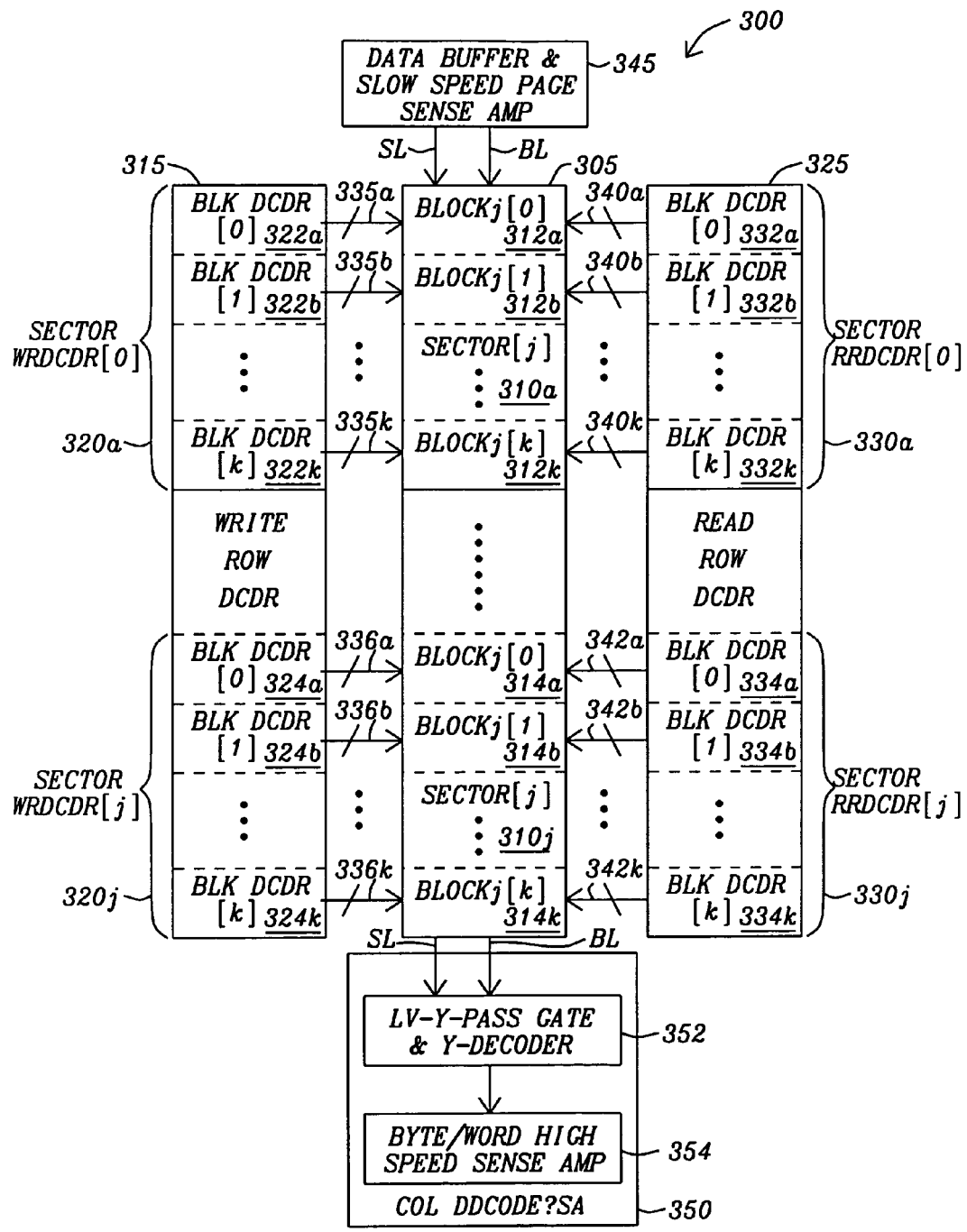
FIG. 6 is a block diagram of an nonvolatile memory device incorporating paired word line pages of the NAND-like dual charge retaining transistor NOR flash memory cells embodying the principles of this invention.

FIG. 6 is a block diagram of a nonvolatile memory device 300 incorporating the paired word line pages of NAND-like dual floating gate transistor NOR flash memory cells 210 of FIG. 5. The nonvolatile memory device 300 has an array of the NAND-like dual floating gate transistor NOR flash memory cells 305 that is subdivided into multiple sectors 310a, . . . 310j. In various embodiments, each sector 310a, . . . 310j occupies a single shallow p-type diffusion well TPW. Each of the sectors 310a, . . . 310j is further divided into multiple blocks 312a, 312b, . . . , 312kk, 314a, 314b, . . . 314k. Each of the blocks 312a, 312b, . . . , 312kk, 314a, 314b, . . . 314k is configured as shown in FIG. 5.

The write row decoder 315 has output lines 335a, 335b, 335k, 336a, 336b, 336k that are connected to the word lines of array of NAND-like dual floating gate transistor NOR flash memory cells 305. The write row decoder 315 is divided into sector write row decoders 320a, . . . , 320j. The sector write row decoders 320a, . . . , 320j are divided into block write row decoders 322a, 322b, . . . 322kk, 324a, 324b, . . . 324k. The block write row decoders 322a, 322b, . . . 322kk, 324a, 324b, . . . 324k provide the necessary voltage levels for programming and erasing selected paired word line pages of NAND-like dual floating gate transistor NOR flash memory cells. The block write row decoders 322a, 322b, . . . 322kk, 324a, 324b, . . . 324k further provide the necessary inhibit voltage levels for protecting paired word line pages of NAND-like dual floating gate transistor NOR flash memory cells from programming and erasing. The write row decoder 315 provides the necessary decoding of address and control for selecting the paired word line pages of NAND-like dual floating gate transistor NOR flash memory cells, sectors 310a, . . . 310j, or blocks 312a, 312b, . . . 312kk, 314a, 314b, . . . 314k of the dual floating gate transistor NOR flash cells. The write row decoder 315 further encodes the input data for programming to the selected paired word line pages of NAND-like dual floating gate transistor NOR flash memory cells.

The read row decoder 325 has output lines 340a, 340b, ... 340k, 3342a, 3342b, ... 3342k that are connected to the word lines of array of NAND-like dual floating gate transistor NOR flash memory cells 305. The read row decoder 325 is divided into sector read row decoders 330a, ..., 330j. The sector read row decoders 330a, ..., 330j are divided into block read row decoders 332a, 332b, ... 332kk, 334a, 334b, ... 334k. The block read row decoders 332a, 332b, ... 332kk, 334a, 334b, ... 334k provide the necessary voltage levels for programming and erasing selected paired word line pages of NAND-like dual floating gate transistor NOR flash memory cells. The block read row decoders 332a, 332b, ... 332kk, 334a, 334b, ... 334k further provide the necessary inhibit voltage levels for protecting paired word line pages of NAND-like dual floating gate transistor NOR flash memory cells from programming and erasing. The read row decoder 325 provides the necessary decoding of address and control for selecting the paired word line pages of NAND-like dual floating gate transistor NOR flash memory cells of the dual floating gate transistor NOR flash cells.

The Data Buffer and Slow Speed Page Sense Amplifier 345 is connected to the bit lines of the array of the NAND-like dual floating gate transistor NOR flash memory cells 305. The input data is encoded to form the program data pattern that is to be programmed to the NAND-like dual floating gate transistor NOR flash memory cells. The program data pattern is stored in the Data Buffer for performing the program operation. The Data Buffer & Slow Speed Page Sense Amplifier 345 is used to perform the precise verification of the threshold voltage (Vt) for the pre-program, erase and program operations at slow speed and with low current. The Data Buffer and Slow Speed Page Sense Amplifier 345 further provides circuitry necessary for sensing the data state of a selected paired word line paired word line page of NAND-like dual floating gate transistor NOR flash memory cells.

The column decoder and sense amplifier 350 includes a Y-pass gate and Y-decoder circuit 352 that receives an address, decodes the address and activates pass gate circuitry to connect selected columns of the NAND-like dual floating gate transistor NOR flash memory cells to the byte/word high speed sense amplifier 354. The Y-pass gate and Y-decoder circuit 352 controls the connection of the bit lines to byte/word high speed sense amplifier 354. Isolation transistors are used to isolate the array of the NAND-like dual floating gate transistor NOR flash memory cells 305 from the Y-pass gate and Y-decoder circuit 352 while performing erase or program operations. The isolate devices activated for sensing of the data state of the selected NAND-like dual floating gate transistor NOR flash memory cells 305 by the Byte/Word High Speed Sense Amp 354.

During program and erase operations, the column decode and sense amplifier circuit 350 decodes the address to connect selected bit lines of the array of the NAND-like dual floating gate transistor NOR flash memory cells 305 to the required program and erase voltages as described hereinafter.

Figure 7:
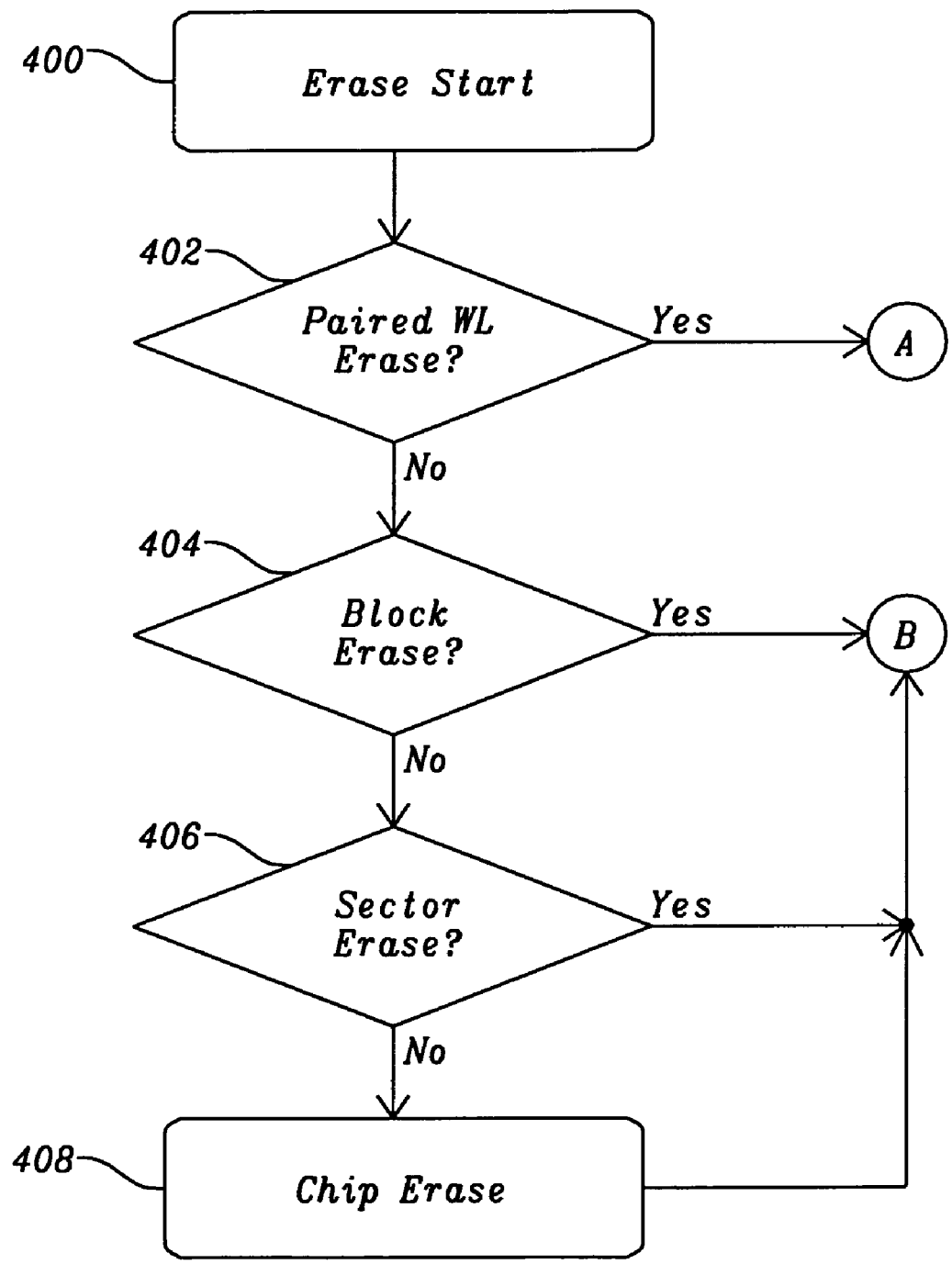
FIG. 7 is a flow chart of an erase operation for an array of NAND-like dual charge retaining transistor NOR flash memory cells embodying the principles of this invention.
Figure 8:
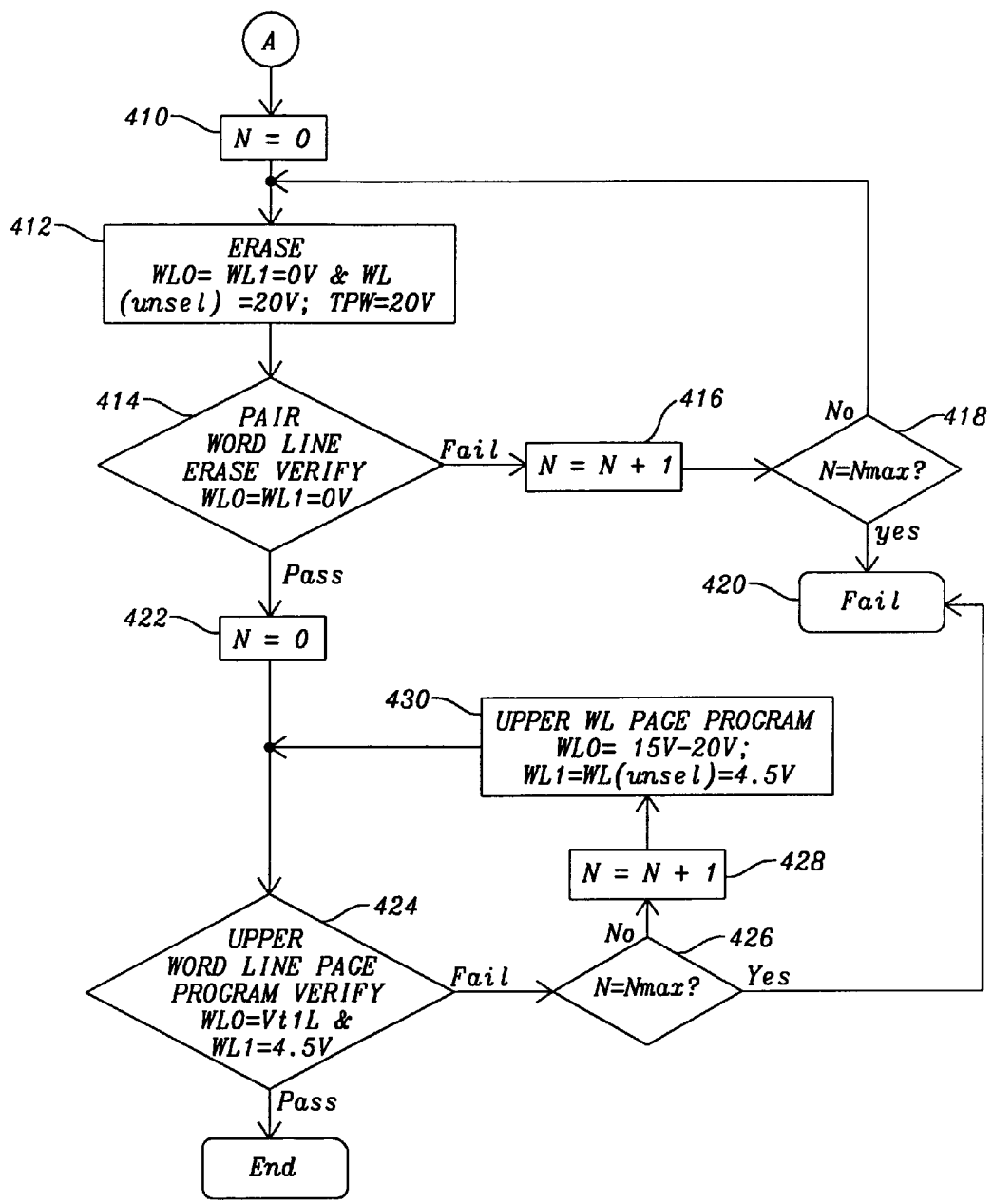
FIG. 8 is a flow chart of an erase operation for a paired word line page of NAND-like dual charge retaining transistor NOR flash memory cells within an array of NAND-like dual charge retaining transistor NOR flash memory cells embodying the principles of this invention.
Figure 9:
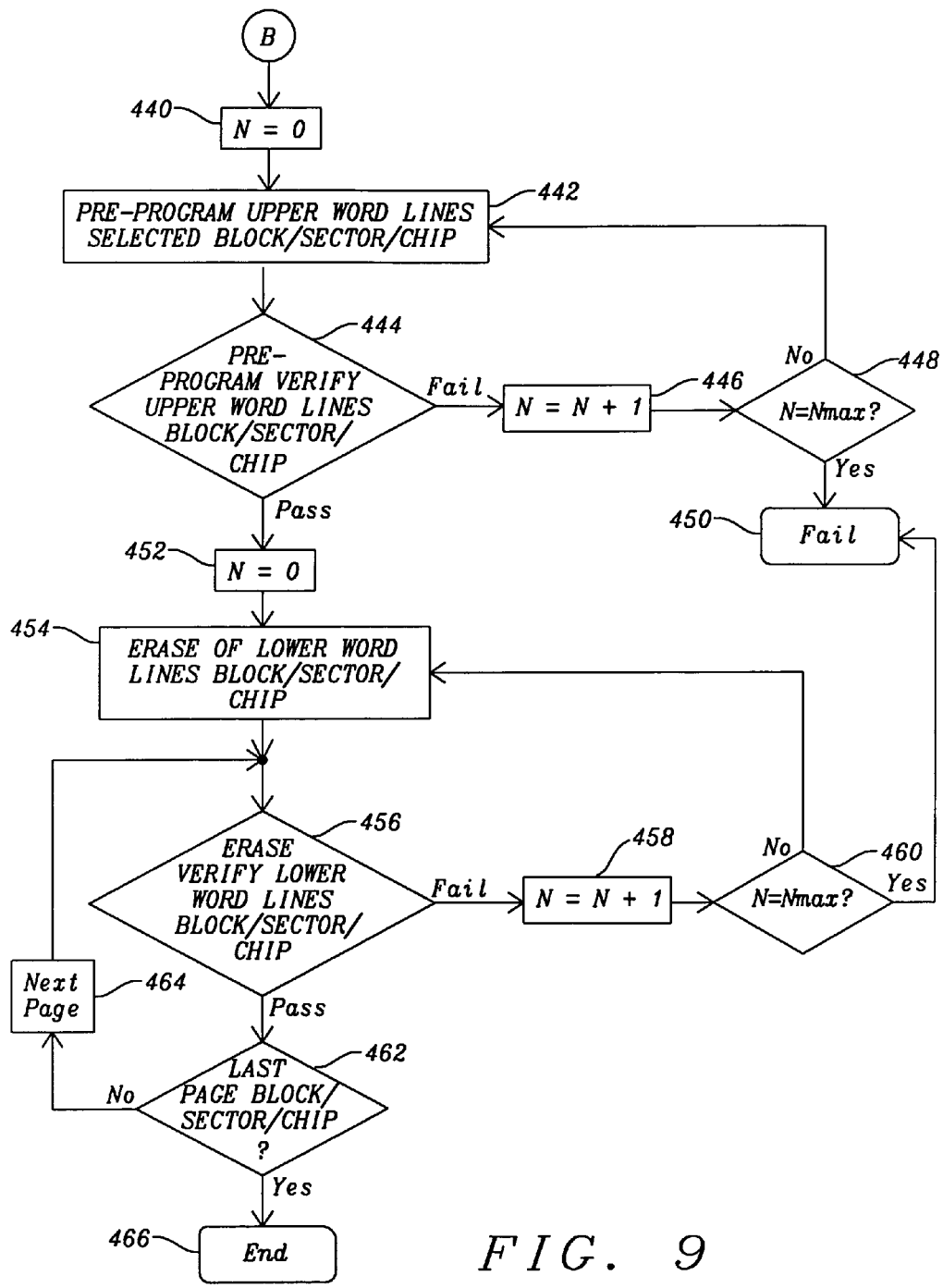
FIG. 9 is a flow chart of an preprogram operation for a block, sector, or an entire chip of an array of NAND-like dual charge retaining transistor NOR flash memory cells embodying the principles of this invention.

FIG. 7 is a flow chart of an erase operation for an array of NAND-like dual floating gate transistor NOR flash memory cells. FIG. 8 is a flow chart of an erase operation for a paired word line page of NAND-like dual floating gate transistor NOR flash memory cells within an array of NAND-like dual floating gate transistor NOR flash memory cells. FIG. 9 is a flow chart of an pre-program operation for a block, sector, or an entire chip of an array of NAND-like dual floating gate transistor NOR flash memory cells. FIG. 10 is a table of the voltage levels applied to the terminals of an array of NAND-like dual floating gate transistor NOR flash memory cells for an erase operation and an erase verify operation. FIG. 11 is a table of the voltage levels applied to the terminals of an array of NAND-like dual floating gate transistor NOR flash memory cells for the pre-programming operation. For a discussion of the erase operation of selected NAND-like dual floating gate transistor NOR flash memory cells 210, refer now to FIGS. 5-11. For this discussion, the selected NAND-like dual floating gate transistor NOR flash memory cells 210 are connected to the word lines WL0 and WL1 and the unselected NAND-like dual floating gate transistor NOR flash memory cells 210 are connected to the word lines WL2, WL3, ..., WLm−1, and WLm. In FIG. 7 an input command is decoded to determine if it is an erase operation. If the command is for an erase operation the procedure begins (Box 400) by determining if the erase operation is an erasure of a single paired word line page of NAND-like dual floating gate transistor NOR flash memory cells 210 (Box 402); determining if the erase operation is the erasure of a block of the paired word line page of NAND-like dual floating gate transistor NOR flash memory cells 210 (Box 404); determining if the erase operation is the erasure of a sector of the paired word line page of NAND-like dual floating gate transistor NOR flash memory cells 210 (Box 406); and determining if the erase operation is the erasure of an entire chip of the paired word line page of NAND-like dual floating gate transistor NOR flash memory cells 210 (Box 408).

If the erase operation is determined (Box 402) to be erasure of a single paired word line page of NAND-like dual floating gate transistor NOR flash memory cells 210, an erase counter is initialized (Box 410) as shown in FIG. 8. The single paired word line page of NAND-like dual floating gate transistor NOR flash memory cells 210 are erased (Box 412). Refer now to FIG. 10 for a discussion of the voltage levels applied to the array of the NAND-like dual floating gate transistor NOR flash memory cells 305 to erase a single paired word line pages of the NAND-like dual floating gate transistor NOR flash memory cells 210. A very large erase voltage level is applied to the shallow p-type diffusion well TPW in which the array of the NAND-like dual floating gate transistor NOR flash memory cells 305 resides. The very large erase voltage level is from approximately +18.0V to approximately 22.0V (nominally +20.0V).

Any other shallow p-type diffusion wells TPW housing unselected arrays of the NAND-like dual floating gate transistor NOR flash memory cells 305 remain biased to the ground reference voltage level (0.0V). The ground reference voltage level (0.0V) is applied to the upper and lower word lines WL0 and WL1 of the single paired word line page of NAND-like dual floating gate transistor NOR flash memory cells 210. The isolation transistors of the write row decoder 315 and the read row decoder 325 are turned off for the unselected word lines word lines WL2, WL3, ..., WLm−1, and WLm and the word lines WL2, WL3, ..., WLm−1, and WLm are allowed to float. The very large erase voltage level is coupled from the shallow p-type diffusion well TPW to the word lines WL2, WL3, ..., WLm−1, and WLm.

The N-type diffusions of the source/drain region (D) 115 of the floating gate transistor M0 and the source/drain region 122 of the floating gate transistor M1 as shown in FIGS. 1b-1 and 1b-2 are connected to the local bit lines LBL0, LBL1, ..., LBLn−1, and LBLn and local source lines LSL0, LSL1, ..., LSLn−1, and LSLn. When the shallow p-type diffusion well TPW is biased to the very large erase voltage level, the junctions between the N-type diffusions of the source/drain region (D) 115 of the floating gate transistor M0 and the source/drain region 122 of the floating gate transistor M1 are forward biased and the local bit lines LBL0, LBL1, ..., LBLn−1, and LBLn and local source lines LSL0, LSL1, ..., LSLn−1, and LSLn have the very large erase voltage forwarded from the shallow p-type diffusion well TPW. The bit line select signals BLG0 and BLG1 connected to the gates of the bit line select transistors 260a, ..., 260n and the source line select signals SLG0 and SLG1 connected to the gates of the source line select transistors 265a, ..., 265n are set to the voltage level of the power supply voltage source VDD to reduce voltage stress on the bit line select transistors 260a, ..., 260n and the source line select transistors 265a, ..., 265n.

Returning to FIG. 8, the single paired word line page of NAND-like dual floating gate transistor NOR flash memory cells 210 are then verified (Box 414). Referring back to FIG. 10, the selected and unselected word lines WL0, WL1, ..., WLm−1, and WLm are biased to the ground reference voltage level (0.0V). The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of the power supply voltage source VDD to turn on the bit line select transistors 260a, ..., 260n to pre-discharge the local bit lines LBL0, LBL1, ..., LBLn−1, and LBLn to the ground reference voltage level. The selected source line select signals SLG0 and SLG1 set to the voltage level of the power supply voltage source VDD line select transistors 265a, ..., 265n to apply a verify voltage level to the local source lines LSL0, LSL1, LSLn−1, and LSLn. The verify voltage level is approximately 1.0V. If any of the selected floating gate transistors M0 and M1 have not been sufficiently erased such that their threshold voltage level has achieved the erased threshold voltage level, the local bit line will remain at the ground reference voltage level (0.0V) as detected by the Data Buffer and Slow Speed Page Sense Amplifier 345. Referring back to FIG. 8, if any of the selected floating gate transistors M0 and M1 have failed the verification (Box 414) of the paired word line page of NAND-like dual floating gate transistor NOR flash memory cells 210, the erase counter is incremented (Box 416) and the erase counter is compared (Box 418) to the maximum erase count Nmax. If the erase counter exceeds the maximum erase count Nmax, the nonvolatile memory device 300 has failed (Box 420). If the erase counter does not exceed the maximum erase count Nmax, the paired word line page of NAND-like dual floating gate transistor NOR flash memory cells is erased (Box 412) and erase verified (Box 414) until all of the floating gate transistors M0 and M1 of the paired word line page of NAND-like dual floating gate transistor NOR flash memory cells 210 pass.

The counter N is initialized (Box 422) to be a program count. The floating gate transistors M0 connected to the upper word line WL0 within the selected single paired word line page of NAND-like dual floating gate transistor NOR flash memory cells 210 are page program verified (Box 424). FIG. 13 is a table of the voltage levels applied to the terminals of an array of NAND-like dual charge retaining transistor NOR flash memory cells 210 for a program operation and a program verify operation. Refer to FIG. 13 for a discussion of an upper word line page program verification procedure, the ground reference voltage level (0.0V) is applied to the unselected word lines WL2, WL3, ..., WLm−1, and WLm. The lower limit of the first programmed threshold voltage level Vt1L is applied to the upper word line WL0 and the pass voltage level VPASS of approximately 4.5V is applied to the lower word line WL1.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of the power supply voltage source VDD to turn on the bit line select transistors 260a, ..., 260n to pre-charge the local bit lines LBL0, LBL1, ..., LBLn−1, and LBLn to a pre-charge voltage level that is approximately the voltage level of the power supply voltage less a NMOS transistor threshold voltage level (VDD-Vt). The selected source line select signals SLG0 and SLG1 set to the voltage level of the power supply voltage source VDD line select transistors 265a, ..., 265n to apply the ground reference voltage level to the local source lines LSL0, LSL1, ..., LSLn−1, and LSLn. If any of the selected floating gate transistors M0 and M1 have not been sufficiently programmed such that their threshold voltage level has achieved the first programmed threshold voltage level, the local bit line will be discharged from the pre-charge voltage level to the ground reference voltage level as detected by the Data Buffer and Slow Speed Page Sense Amplifier 345. Referring back to FIG. 8, if any of the selected floating gate transistors M0 and M1 have failed the verification (Box 424) of the paired word line page of NAND-like dual floating gate transistor NOR flash memory cells, the erase counter is compared (Box 426) to the maximum erase count Nmax. If the erase counter does not exceed the maximum erase count Nmax, the program counter is incremented (Box 428) and the paired word line page of NAND-like dual floating gate transistor NOR flash memory cells is programmed (Box 430).

Refer back to FIG. 13 for a discussion of the upper page word line program procedure (Box 430). The pass voltage level (Vpass) is applied to the unselected word lines WL2, WL3, ..., WLm−1, and WLm. A very large program voltage of from approximately 15.0V to approximately 20.0V is applied to the upper word line WL0 of the selected single paired word line page of NAND-like dual floating gate transistor NOR flash memory cells 210. The pass voltage level (Vpass) is applied to the lower word line WL1 of the selected single paired word line page of NAND-like dual floating gate transistor NOR flash memory cells 210.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of a large bit line select voltage of approximately 10.0V to turn on the bit line select transistors 260a, ..., 260n. The global bit lines are set to the ground reference voltage level to set the local bit lines LBL0, LBL1, ..., LBLn−1, and LBLn connected to the selected floating gate transistors that are to be programmed to the first threshold voltage level (Vt1). The global bit lines are set to a program inhibit voltage level of approximately 8.0V to set the local bit lines LBL0, LBL1, ..., LBLn−1, and LBLn connected to the selected floating gate transistors that are to remain at the erased threshold voltage level (Vt0). The unselected bit line select signals BLG0 and BLG1 are set to the voltage level of the ground reference voltage level (0.0V) to turn off the unselected bit line select transistors 260a, ..., 260n. The selected source line select signals SLG0 and SLG1 are set to the voltage level of a large source line select voltage of approximately 10.0V to turn on the source line select transistors 265a, ..., 265n. The global source lines are set to the ground reference voltage level to set the local source lines LSL0, LSL1, ..., LSLn−1, and LSLn connected to the selected floating gate transistors that are to be programmed to the first threshold voltage level (Vt1). The global source lines are set to the program inhibit source voltage level to set the local source lines LSL0, LSL1, ..., LSLn−1, and LSLn connected to the selected floating gate transistors that are to remain at the erased threshold voltage level (Vt0). The unselected source line select signals SLG0 and SLG1 are set to the voltage level of the ground reference voltage level (0.0V) to turn off the unselected source line select transistors 265a, ..., 265n.

Referring back to FIG. 8, after the upper page word line program procedure (Box 430), the floating gate transistors M0 connected to the upper word line WL0 within the selected single paired word line page of NAND-like dual floating gate transistor NOR flash memory cells 210 are page program verified (Box 424). If the floating gate transistors M0 are not successfully programmed and the erase counter exceeds the maximum erase count Nmax, the nonvolatile memory device 300 has failed (Box 420). If the floating gate transistors M0 are successfully programmed to the first programmed threshold voltage level Vt1, the erase operation is complete.

Referring back to FIG. 7, if the erase is determined to be a block erase (Box 404), sector erase (Box 406), or chip erase (Box 408), the erase procedure is as described in FIG. 9. Referring to FIG. 9, the counter N is initialized (Box 440) to contain pre-program count. The floating gate transistors M0 of the upper word lines of each of the paired word line page of NAND-like dual floating gate transistor NOR flash memory cells 210 within a selected block, sector, or chip are pre-programmed (Box 442) to the first programmed threshold voltage level Vt1. Refer now to FIG. 11 for a discussion of the pre-program procedure. For a block pre-program procedure, all the word lines WL0, WL1, ..., WLm−1, and WLm of the unselected blocks of NAND-like dual floating gate transistor NOR flash memory cells 210 of the chip are set to the ground reference voltage level (0.0V). The upper word lines WL0, WL2, ..., and WLm−1 of the selected block of NAND-like dual floating gate transistor NOR flash memory cells 210 are connected to receive the very large programming voltage of approximately 20.0V. The lower word lines WL1, WL3, ..., WLm−2, and WLm of the selected block of NAND-like dual floating gate transistor NOR flash memory cells 210 are connected to receive the ground reference voltage level (0.0V).

The Data Buffer and Slow Speed Page Sense Amplifier 345 is activated to be connected to the global bit lines GBL0, ..., GBLn and the global source lines GSL0, ..., GSLn. The bit line select signals BLG0 and BLG1 and the source line select signals SLG0 and SLG1 are set to the voltage level of the power supply voltage source VDD to turn on the bit line select transistors 260a, ..., 260n and source line select transistors 265a, ..., 265n to set the local bit lines LBL0, LBL1, ..., LBLn−1, and LBLn and the local source lines LSL0, LSL1, ..., LSLn−1, and LSLn to ground reference voltage level (0.0V) to pre-program the upper word lines WL0, WL2, ..., and WLm−1, of the selected block of NAND-like dual floating gate transistor NOR flash memory cells 210 to the first programmed threshold voltage level.

For a sector pre-program procedure, all the word lines WL0, WL1, ..., WLm−1, and WLm of the unselected sectors of the chip of NAND-like dual floating gate transistor NOR flash memory cells 210 of the chip are set to the ground reference voltage level (0.0V). The upper word lines WL0, WL2, ..., and WLm−1, of the selected sector of NAND-like dual floating gate transistor NOR flash memory cells 210 are connected to receive the very large programming voltage of approximately 20.0V. The lower word lines WL1, WL3, ..., WLm−2, and WLm of the selected sector of NAND-like dual floating gate transistor NOR flash memory cells 210 are connected to receive the ground reference voltage level (0.0V).

The Data Buffer and Slow Speed Page Sense Amplifier 345 is activated to be connected to the global bit lines GBL0, ..., GBLn and the global source lines GSL0 ..., GSLn. The bit line select signals BLG0 and BLG1 and the source line select signals SLG0 and SLG1 are set to the voltage level of the power supply voltage source VDD to turn on the bit line select transistors 260a, ..., 260n and source line select transistors 265a, ..., 265n to set the local bit lines LBL0, LBL1, ..., LBLn−1, and LBLn and the local source lines LSL0, LSL1, ..., LSLn−1, and LSLn to ground reference voltage level (0.0V) to pre-program the upper word lines WL0, WL2, ..., and WLm−1, of the selected sector of NAND-like dual floating gate transistor NOR flash memory cells 210 to the first programmed threshold voltage level.

For an entire chip pre-program procedure, all the upper word lines WL0, WL2, ..., and WLm−1 of the entire chip of NAND-like dual floating gate transistor NOR flash memory cells 210 are connected to receive the very large programming voltage of approximately 20.0V. The lower word lines WL1, WL3, ..., WLm−2, and WLm of the entire chip of NAND-like dual floating gate transistor NOR flash memory cells 210 are connected to receive the ground reference voltage level (0.0V).

The Data Buffer and Slow Speed Page Sense Amplifier 345 is activated to be connected to the global bit lines GBL0, ..., GBLn and the global source lines GSL0, ..., GSLn. The bit line select signals BLG0 and BLG1 and the source line select signals SLG0 and SLG1 are set to the voltage level of the power supply voltage source VDD to turn on the bit line select transistors 260a, ..., 260n and source line select transistors 265a, ..., 265n to set the local bit lines LBL0, LBL1, ..., LBLn−1, and LBLn and the local source lines LSL0, LSL1, ..., LSLn−1, and LSLn to ground reference voltage level (0.0V) to pre-program the upper word lines WL0, WL2, ..., and WLm−1, of the entire of NAND-like dual floating gate transistor NOR flash memory cells 210 to the first programmed threshold voltage level.

Returning to FIG. 9. at the completion of the pre-program procedure, the selected block, sector, or the entire chip is pre-program verified (Box 444). Referring back to FIG. 11, the block pre-program verify procedure begins by setting all the word lines WL0, WL1, ..., WLm−1, and WLm of the unselected blocks of NAND-like dual floating gate transistor NOR flash memory cells 210 of the chip to the ground reference voltage level (0.0V). The upper word lines WL0, WL2, ..., and WLm−1 of the selected block of NAND-like dual floating gate transistor NOR flash memory cells 210 are connected to receive the lower limit of the first programmed threshold voltage level (Vt1L). The lower word lines WL0, WL2, ..., WLm−2, and WLm of the selected block of NAND-like dual floating gate transistor NOR flash memory cells 210 are connected to receive a second pass voltage level of greater than (6.0V).

The Data Buffer and Slow Speed Page Sense Amplifier 345 is activated to be connected to the global bit lines GBL0, ..., GBLn and the global source lines GSL0, ..., GSLn. The bit line select signals BLG0 and BLG1 and the source line select signals SLG0 and SLG1 are set to the voltage level of the power supply voltage source VDD to turn on the bit line select transistors 260a, ..., 260n and source line select transistors 265a, ..., 265n to set the selected local bit lines LBL0, LBL1, ..., LBLn−1, and LBLn to the pre-charge voltage level that is approximately the voltage level of the power supply voltage source less a NMOS transistor threshold voltage level (VDD-Vt). The non-selected local bit lines LBL0, LBL1, ..., LBLn−1, and LBLn are set the ground reference voltage level (0.0V). The source line select signals SLG0 and SLG1 are set to the voltage level of the power supply voltage source VDD to turn on the source line select transistors 265a, ..., 265n to set the local source lines LSL0, LSL1, ..., LSLn−1, and LSLn to ground reference voltage level (0.0V).

If any of the selected floating gate transistors M0 of the upper word lines WL0, WL2, . . . , and WLm−1 of the selected block of NAND-like dual floating gate transistor NOR flash memory cells 210 have not been sufficiently programmed such that their threshold voltage level has achieved the first programmed threshold voltage level Vt1L, the local bit line will be discharged from the pre-charge voltage level to the ground reference voltage level as detected by the Data Buffer and Slow Speed Page Sense Amplifier 345. Referring back to FIG. 9, if any of the selected floating gate transistors M0 and M1 have failed the verification (Box 444) of the paired word line page of NAND-like dual floating gate transistor NOR flash memory cells, the program counter is incremented (Box 446) and the pre-program counter is compared (Box 448) to the maximum pre-program count Nmax. If the pre-program counter does not exceed the maximum erase count Nmax, the upper word lines of the page of NAND-like dual floating gate transistor NOR flash memory cells is pre-programmed (Box 442) and pre-programmed verification (Box 444). If the pre-program counter is comparison to the (Box 448) exceeds the maximum pre-program count Nmax, the nonvolatile memory device 300 has failed (Box 450).

If the selected floating gate transistors M0 of the upper word lines WL0, WL2, . . . , and WLm−1, of the selected block of NAND-like dual floating gate transistor NOR flash memory cells 210 have passed the pre-program verification (Box 444), the counter N is initialized (Box 452) as an erase counter. The selected floating gate transistors M1 of the lower word lines WL1, WL3, . . . , and WLm−2, and WLm of the selected block of NAND-like dual floating gate transistor NOR flash memory cells 210 are erased (Box 454). Refer back to FIG. 10 for a discussion of erasure (Box 454) of a block, sector, or a whole chip of NAND-like dual floating gate transistor NOR flash memory cells 210. For a block erase procedure, the very large erase voltage level of approximately 20.0V is applied to the shallow p-type diffusion well TPW. All the word lines WL0, WL1, . . . , WLm−1, and WLm of the unselected blocks of NAND-like dual floating gate transistor NOR flash memory cells 210 within a selected sector are disconnected from the write row decoder 315 and the read row decoder 325 and allowed to float. When the very large erase voltage level is applied to the shallow p-type diffusion well TPW, the very large erase voltage level is coupled to the all the word lines WL0, WL1, . . . , WLm−1, and WLm of the unselected blocks of NAND-like dual floating gate transistor NOR flash memory cells 210. Similarly, the upper word lines WL0, WL2, . . . , and WLm−1, of the selected block of NAND-like dual floating gate transistor NOR flash memory cells 210 are disconnected from the write row decoder 315 and the read row decoder 325 and allowed to float. When the very large erase voltage level is applied to the shallow p-type diffusion well TPW, the very large erase voltage level is coupled to the upper word lines WL0, WL2, . . . , and WLm−1 of the selected block of NAND-like dual floating gate transistor NOR flash memory cells 210. The lower word lines WL1, WL3, . . . , WLm−2, and WLm of the selected block of NAND-like dual floating gate transistor NOR flash memory cells 210 are connected to receive the ground reference voltage level (0.0V).

The N-type diffusions of the source/drain region (D) 115 of the floating gate transistor M0 and the source/drain region 122 of the floating gate transistor M1 as shown in FIGS. 1b-1 and 1b-2 are connected to the local bit lines LBL0, LBL1, . . . , LBLn−1, and LBLn and local source lines LSL0, LSL1, . . . , LSLn−1, and LSLn. When the shallow p-type diffusion well TPW is biased to the very large erase voltage level, the junctions between the N-type diffusions of the source/drain region (D) 115 of the floating gate transistor M0 and the source/drain region 122 of the floating gate transistor M1 are forward biased and the local bit lines LBL0, LBL1, . . . , LBLn−1, and LBLn and local source lines LSL0, LSL1, . . . , LSLn−1, and LSLn have the very large erase voltage forwarded from the shallow p-type diffusion well TPW. The bit line select signals BLG0 and BLG1 connected to the gates of the bit line select transistors 260a, . . . , 260n and the source line select signals SLG0 and SLG1 connected to the gates of the source line select transistors 265a, . . . , 265n associated with the selected and unselected single paired word line page of NAND-like dual floating gate transistor NOR flash memory cells 210 are set to the voltage level of the power supply voltage source VDD to reduces voltage stress on the bit line select transistors 260a, . . . , 260n and the source line select transistors 265a, . . . , 265n.

For a sector or chip erase procedure, the very large erase voltage level of approximately 20.0V is applied to the shallow p-type diffusion well TPW. All the NAND-like dual floating gate transistor NOR flash memory cells 210 of a sector or chip are to be erased and there are no "unselected" paired word lines of NAND-like dual floating gate transistor NOR flash memory cells 210. The upper word lines WL0, WL2, . . . , and WLm−1 of the selected sector or chip of NAND-like dual floating gate transistor NOR flash memory cells 210 are disconnected from the write row decoder 315 and the read row decoder 325 and allowed to float. When the very large erase voltage level is applied to the shallow p-type diffusion well TPW, the very large erase voltage level is coupled to the upper word lines WL0, WL2, . . . , and WLm−1 of the selected sector or chip of NAND-like dual floating gate transistor NOR flash memory cells 210. The lower word lines WL1, WL3, . . . , WLm−2, and WLm of the selected sector or chip of NAND-like dual floating gate transistor NOR flash memory cells 210 are connected to receive the ground reference voltage level (0.0V).

The N-type diffusions of the source/drain region (D) 115 of the floating gate transistor M0 and the source/drain region 122 of the floating gate transistor M1 as shown in FIGS. 1b-1 and 1b-2 are connected to the local bit lines LBL0, LBL1, . . . , LBLn−1, and LBLn and local source lines LSL0, LSL1, . . . , LSLn−1, and LSLn. When the shallow p-type diffusion well TPW is biased to the very large erase voltage level, the junctions between the N-type diffusions of the source/drain region (D) 115 of the floating gate transistor M0 and the source/drain region 122 of the floating gate transistor M1 are forward biased and the local bit lines LBL0, LBL1, . . . , LBLn−1, and LBLn and local source lines LSL0, LSL1, . . . , LSLn−1, and LSLn have the very large erase voltage forwarded from the shallow p-type diffusion well TPW. The bit line select signals BLG0 and BLG1 connected to the gates of the bit line select transistors 260a, . . . , 260n and the source line select signals SLG0 and SLG1 connected to the gates of the source line select transistors 265a, . . . , 265n associated with the selected and unselected single paired word line page of NAND-like dual floating gate transistor NOR flash memory cells 210 are set to the voltage level of the power supply voltage source VDD to reduces voltage stress on the bit line select transistors 260a, . . . , 260n and the source line select transistors 265a, . . . , 265n.

Returning to FIG. 9, the NAND-like dual floating gate transistor NOR flash memory cells 210 connected to the lower word lines WL1, WL3, . . . , WLm−2, and WLm of the erased block, sector, or chip are then erase verified (Box 456). Referring back to FIG. 10, The unselected word lines WL0, WL1, . . . , WLm−1, and WLm are biased to the ground reference voltage level (0.0V). The pass voltage level Vpass is applied to one of the upper word lines WL0, WL2, ..., and WLm−1 of the selected block, sector, or chip of the NAND-like dual floating gate transistor NOR flash memory cells 210. The ground reference voltage level (0.0V) is applied to one of the lower word lines WL1, WL3, ..., WLm−2, and WLm of the selected block, sector, or chip of the NAND-like dual floating gate transistor NOR flash memory cells 210.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of the power supply voltage source VDD to turn on the bit line select transistors 260a, ..., 260n to pre-discharge the local bit lines LBL0, LBL1, ..., LBLn−1, and LBLn to the ground reference voltage level. The selected source line select signals SLG0 and SLG1 set to the voltage level of the power supply voltage source VDD line select transistors 265a, ..., 265n to apply the erase verify voltage level to the local source lines LSL0, LSL1, ..., LSLn−1, and LSLn. The erase verify voltage level is approximately 1.0V. The unselected local bit lines LBL0, LBL1, ..., LBLn−1, and LBLn and local source lines LSL0, LSL1, ..., LSLn−1, and LSLn are connected to the ground reference voltage level. If any of the selected floating gate transistors M1 have not been sufficiently erased such that their threshold voltage level has achieved the erased threshold voltage level, the local bit line will remain at the ground reference voltage level (0.0V) as detected by the Data Buffer and Slow Speed Page Sense Amplifier 345.

Referring back to FIG. 8, if any of the selected floating gate transistors M1 have failed the verification (Box 456) of the lower word lines WL1, WL3, ..., WLm−2, and WLm of NAND-like dual floating gate transistor NOR flash memory cells 210, the erase counter is incremented (Box 458) and the erase counter is compared (Box 460) to the maximum erase count Nmax. If the erase counter exceeds the maximum erase count Nmax, the nonvolatile memory device 300 has failed (Box 450). If the erase counter does not exceed the maximum erase count Nmax, the lower word line WL1, WL3, ..., WLm−2, and WLm of the NAND-like dual floating gate transistor NOR flash memory cells 210 is erased (Box 454) and erase verified (Box 456) until all of the floating gate transistors M1 of the lower word line WL1, WL3,..., WLm−2, and WLm of NAND-like dual floating gate transistor NOR flash memory cells 210 pass. A page count of the selected block, sector, or chip is examined (Box 462) to determine if the last paired word line page of NAND-like dual floating gate transistor NOR flash memory cells 210 of the selected block, sector, or page have been verified. If the last page has not been verified, the next page of the paired word line pages of NAND-like dual floating gate transistor NOR flash memory cells 210 of the selected block, sector, or chip is selected (Box 464) and the page is verified as above described. When the last page is determined (Box 462) the block, sector, or chip erase is completed and the erase operation of FIG. 7 is completed.

Figure 12:
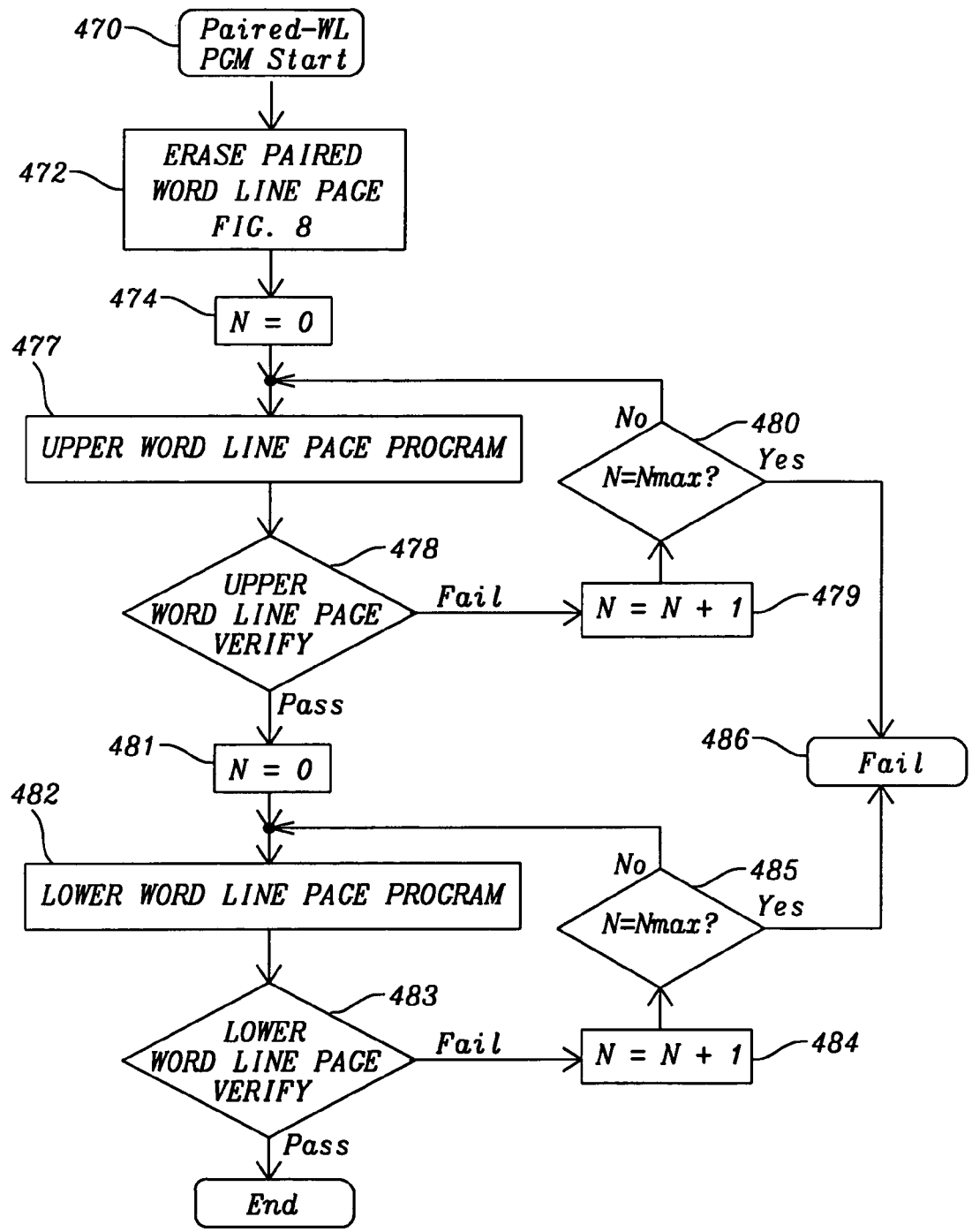
FIG. 12 is a flow chart of a program operation for of a paired word line page of NAND-like dual charge retaining transistor NOR flash memory cells of an array of NAND-like dual charge retaining transistor NOR flash memory cells embodying the principles of this invention.

FIG. 12 is a flow chart of a program operation for of a paired word line page of NAND-like dual charge retaining transistor NOR flash memory cells of an array of NAND-like dual charge retaining transistor NOR flash memory cells. FIG. 13 is a table of the voltage levels applied to the terminals of an array of NAND-like dual charge retaining transistor NOR flash memory cells for a program operation and a program verify operation. For a discussion of the program operation of selected NAND-like dual floating gate transistor NOR flash memory cells 210, refer now to FIGS. 5, 6, 12, and 13. For this discussion, the selected NAND-like dual floating gate transistor NOR flash memory cells 210 are connected to the word lines WL0 and WL1 and the unselected NAND-like dual floating gate transistor NOR flash memory cells 210 are connected to the word lines WL2, WL3, ..., WLm−1, and WLm. In FIG. 12 an input command is decoded to determine if it is a program operation. If the command is for an programming operation the operation is started (Box 470) with an erase procedure (Box 472) is performed to the floating gate transistors M0 & M1 of the upper and lower word lines WL0 and WL1 of the selected paired word line page of NAND-like dual floating gate transistor NOR flash memory cells 210. The erase of the selected paired word line page of NAND-like dual floating gate transistor NOR flash memory cells 210 is as described above in FIGS. 8 and 10.

The counter N is initialized (Box 474) to be a program count. The floating gate transistors M0 connected to the upper word line WL0 of the paired word line page of NAND-like dual floating gate transistor NOR flash memory cells 210 are programmed (Box 476). Refer back to FIG. 13 for a discussion of the upper page word line program procedure (Box 476). The pass voltage level (Vpass) is applied to the unselected word lines WL2, WL3,..., WLm−1, and WLm. A very large program voltage of from approximately 15.0V to approximately 20.0V is applied to the upper word line WL0 of the selected single paired word line page of NAND-like dual floating gate transistor NOR flash memory cells 210. The pass voltage level (Vpass) is applied to the lower word line WL1 of the selected single paired word line page of NAND-like dual floating gate transistor NOR flash memory cells 210.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of a large bit line select voltage of approximately 10.0V to turn on the bit line select transistors 260a, ..., 260n. The global bit lines are set to the ground reference voltage level to set the local bit lines LBL0, LBL1, ..., LBLn−1, and LBLn connected to the selected floating gate transistors that are to be programmed to the first threshold voltage level (Vt1). The global bit lines are set to a program inhibit voltage level of approximately 8.0V to set the local bit lines LBL0, LBL1, ..., LBLn−1, and LBLn connected to the selected floating gate transistors that are to remain at the erased threshold voltage level (Vt0). The unselected bit line select signals BLG0 and BLG1 are set to the voltage level of the ground reference voltage level (0.0V) to turn off the unselected bit line select transistors 260a, ..., 260n. The selected source line select signals SLG0 and SLG1 are set to the voltage level of a large source line select voltage of approximately 10.0V to turn on the source line select transistors 265a, ..., 265n. The global source lines are set to the ground reference voltage level to set the local source lines LSL0, LSL1, ..., LSLn−1, and LSLn connected to the selected floating gate transistors that are to be programmed to the first threshold voltage level (Vt1). The global source lines are set to a program inhibit voltage level of approximately 8.0V to set the local source lines LSL0, LSL1, ..., LSLn−1, and LSLn connected to the selected floating gate transistors that are to remain at the erased threshold voltage level (Vt0). The unselected source line select signals SLG0 and SLG1 are set to the voltage level of the ground reference voltage level (0.0V) to turn off the unselected source line select transistors 265a, ..., 265n.

Returning to FIG. 12, the floating gate transistors M0 connected to the upper word line WL0 within the selected single paired word line page of NAND-like dual floating gate transistor NOR flash memory cells 210 are page program verified (Box 478). Referring to FIG. 13 for a discussion of an upper word line page program verification procedure, the ground reference voltage level (0.0V) is applied to the unselected word lines WL2, WL3, ..., WLm−1, and WLm. The lower limit of the first programmed threshold voltage level Vt1L is applied to the upper word line WL0 and the pass voltage level VPASS of approximately 4.5V is applied to the lower word line WL1.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of the power supply voltage source VDD to turn on the bit line select transistors 260a, ..., 260n to pre-charge the local bit lines LBL0, LBL1, ..., LBLn−1, and LBLn to a pre-charge voltage level that is approximately the voltage level of the power supply voltage source less a NMOS transistor threshold voltage level (VDD-Vt). The selected source line select signals SLG0 and SLG1 set to the voltage level of the power supply voltage source VDD line select transistors 265a, ..., 265n to apply the ground reference voltage level to the local source lines LSL0, LSL1, ..., LSLn−1, and LSLn. If any of the selected floating gate transistors M0 have not been sufficiently programmed such that their threshold voltage level has achieved the first programmed threshold voltage level, the local bit line will remain at the pre-charge voltage level as detected by the Data Buffer and Slow Speed Page Sense Amplifier 345. Referring back to FIG. 12, if any of the selected floating gate transistors M0 and M1 have failed the verification (Box 478) of the paired word line page of NAND-like dual floating gate transistor NOR flash memory cells, the program counter is incremented (Box 479) and the program counter is compared (Box 480) to the maximum program count Nmax. If the program counter exceeds the maximum program count Nmax, the nonvolatile memory device 300 has failed (Box 486). If the program counter does not exceed the maximum program count Nmax, the upper word line WL0 of the page of NAND-like dual floating gate transistor NOR flash memory cells 210 is programmed (Box 472) and programmed verified (Box 478) until all of the floating gate transistors M0 connected to the upper word line WL0 of the paired word line page of NAND-like dual floating gate transistor NOR flash memory cells 210 pass.

Returning to FIG. 12, the counter N is re-initialized (Box 481) to be a program count. The floating gate transistors M1 connected to the lower word line WL1 of the paired word line page of NAND-like dual floating gate transistor NOR flash memory cells 210 are programmed (Box 482). Refer back to FIG. 13 for a discussion of the lower page word line program procedure (Box 482). The pass voltage level (Vpass) is applied to the unselected word lines WL2, WL3, ..., WLm−1, and WLm. A very large program voltage of from approximately 15.0V to approximately 20.0V is applied to the lower word line WL1 of the selected single paired word line page of NAND-like dual floating gate transistor NOR flash memory cells 210. The pass voltage level (Vpass) is applied to the lower word line WL0 of the selected single paired word line page of NAND-like dual floating gate transistor NOR flash memory cells 210.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of a large bit line select voltage of approximately 10.0V to turn on the bit line select transistors 260a, ..., 260n. The global bit lines are set to the ground reference voltage level to set the local bit lines LBL0, LBL1, ..., LBLn−1, and LBLn connected to the selected floating gate transistors that are to be programmed to the first threshold voltage level (Vt1). The global bit lines are set to a program inhibit voltage level of approximately 8.0V to set the local bit lines LBL0, LBL1, ..., LBLn−1, and LBLn connected to the selected floating gate transistors that are to remain at the erased threshold voltage level (Vt0). The unselected bit line select signals BLG0 and BLG1 are set to the voltage level of the ground reference voltage level (0.0V) to turn off the unselected bit line select transistors 260a, ..., 260n. The selected source line select signals SLG0 and SLG1 are set to the voltage level of a large source line select voltage of approximately 10.0V to turn on the source line select transistors 265a, ..., 265n. The global source lines are set to the ground reference voltage level to set the local source lines LSL0, LSL1, ..., LSLn−1, and LSLn connected to the selected floating gate transistors that are to be programmed to the first threshold voltage level (Vt1). The global source lines are set to a program inhibit voltage level of approximately 8.0V to set the local source lines LSL0, LSL1, ..., LSLn−1, and LSLn connected to the selected floating gate transistors that are to remain at the erased threshold voltage level (Vt0). The unselected source line select signals SLG0 and SLG1 are set to the voltage level of the ground reference voltage level (0.0V) to turn off the unselected source line select transistors 265a, ..., 265n.

Returning to FIG. 12, the floating gate transistors M1 connected to the lower word line WL1 within the selected single paired word line page of NAND-like dual floating gate transistor NOR flash memory cells 210 are page program verified (Box 483). Referring to FIG. 13 for a discussion of a lower word line page program verification procedure, the ground reference voltage level (0.0V) is applied to the unselected word lines WL2, WL3, ..., WLm−1, and WLm. The lower limit of the first programmed threshold voltage level Vt1L is applied to the lower word line WL1 and the pass voltage level VPASS of approximately 4.5V is applied to the upper word line WL0.

The Data Buffer and Slow Speed Page Sense Amplifier 345 is activated to be connected to the global bit lines GBL0, ..., GBLn and the global source lines GSL0, ..., GSLn. The selected bit line select signals BLG0 and BLG1 are set to the voltage level of the power supply voltage source VDD to turn on the bit line select transistors 260a, ..., 260n to pre-charge the local bit lines LBL0, LBL1, ..., LBLn−1, and LBLn to a pre-charge voltage level that is approximately the voltage level of the power supply voltage source less a NMOS transistor threshold voltage level (VDD-Vt). The selected source line select signals SLG0 and SLG1 set to the voltage level of the power supply voltage source VDD line select transistors 265a, ..., 265n to apply the ground reference voltage level to the local source lines LSL0, LSL1, ..., LSLn−1, and LSLn. If any of the selected floating gate transistors M1 and M1 have not been sufficiently programmed such that their threshold voltage level has achieved the first programmed threshold voltage level, the local bit line will remain at the pre-charge voltage level as detected by the Data Buffer and Slow Speed Page Sense Amplifier 345. Referring back to FIG. 12, if any of the selected floating gate transistors M1 have failed the program verification (Box 483) of the paired word line page of NAND-like dual floating gate transistor NOR flash memory cells, the program counter is incremented (Box 484) and the program counter is compared (Box 485) to the maximum program count Nmax. If the program counter exceeds the maximum program count Nmax, the nonvolatile memory device 300 has failed (Box 486). If the program counter does not exceed the maximum program count Nmax, the lower word line WL1 of the page of NAND-like dual floating gate transistor NOR flash memory cells 210 is programmed (Box 482) and programmed verified (Box 483) until all of the floating gate transistors M1 connected to the lower word line WL1 of the paired word line page of NAND-like dual floating gate transistor NOR flash memory cells 210 that are to be programmed to the first programmed threshold voltage level Vt1 pass the verification procedure (Box 483). For those of the floating gate transistors M1 connected to the lower word line WL1 of the paired word line page of NAND-like dual floating gate transistor NOR flash memory cells 210 that are to be programmed to the second programmed threshold voltage level Vt2 are further programmed (Box 482) and programmed verified (Box 483) until all of the floating gate transistors M1 connected to the lower word line WL1 of the paired word line page of NAND-like dual floating gate transistor NOR flash memory cells 210 that are to be programmed to the second programmed threshold voltage level pass Vt2 the verification procedure (Box 483). Once all of the selected floating gate transistors M0 and M1 connected to the upper word line WL0 and the lower word line WL1 of the selected paired word line page of NAND-like dual floating gate transistor NOR flash memory cells 210 are programmed, the program procedure of the paired word line page of NAND-like dual floating gate transistor NOR flash memory cells 210 is ended.

Figure 14:
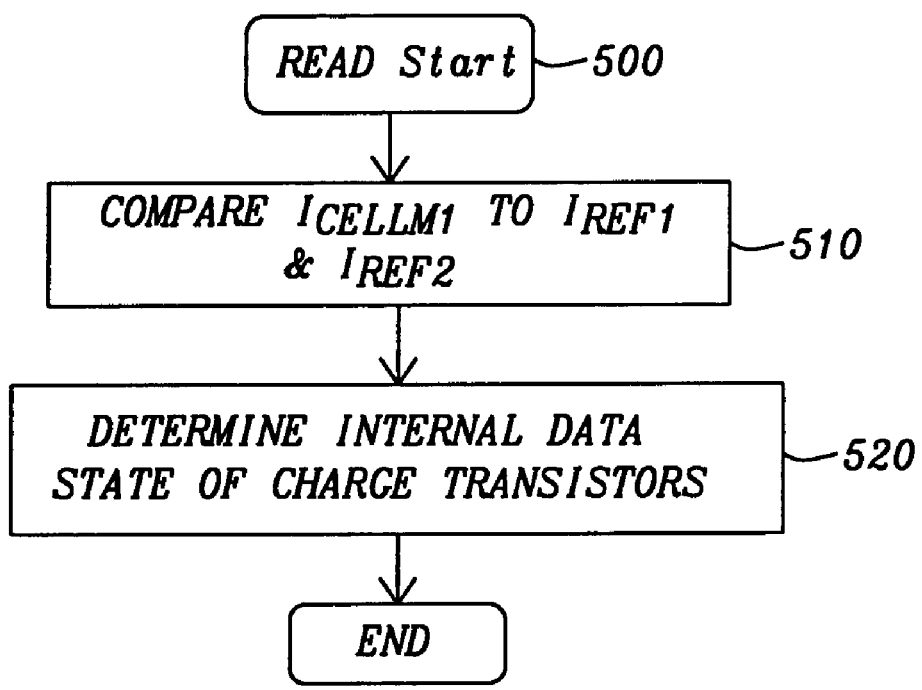
FIG. 14 is a flow chart of a read operation for NAND-like dual charge retaining transistor NOR flash memory cells of an array of NAND-like dual charge retaining transistor NOR flash memory cells embodying the principles of this invention.

FIG. 14 is a flow chart of a read operation for selected NAND-like dual floating gate transistor NOR flash memory cells of an array of NAND-like dual charge retaining transistor NOR flash memory cells. FIG. 15 is a table of the voltage levels applied to the terminals of an array of NAND-like dual floating gate transistor NOR flash memory cells for a read operation embodying the principles of this invention. For a discussion of the read operation of selected NAND-like dual floating gate transistor NOR flash memory cells 210, refer now to FIGS. 5, 6, 14, and 15. For this discussion, the selected NAND-like dual floating gate transistor NOR flash memory cells 210 are connected to the word lines WL0 and WL1 and the unselected NAND-like dual floating gate transistor NOR flash memory cells 210 are connected to the word lines WL2, WL3, . . . , WLm−1, and WLm. In FIG. 14 is started (Box 500 by applying the ground reference voltage (0.0V) to unselected word lines WL2, WL3, . . . , WLm−1, and WLm as shown in FIG. 15. The read reference voltage level VR is applied to the selected word line WL0 or WL1 and the pass voltage level Vpass is applied to the unselected word line WL1 or WL0. The read reference voltage level VR is approximately 2.7V and the pass voltage level Vpass is 4.5V.

The Data Buffer and Slow Speed Page Sense Amplifier 345 is activated to be connected to the global bit lines GBL0, . . . , GBLn and the global source lines GSL0, . . . , GSLn. The selected bit line select signals BLG0 and BLG1 are set to the voltage level of the power supply voltage source VDD to turn on the bit line select transistors 260a, . . . , 260n to pre-charge the local bit lines LBL0, LBL1, . . . , LBLn−1, and LBLn to a read bias voltage level that is approximately 1.0V. The selected source line select signals SLG0 and SLG1 set to the voltage level of the power supply voltage source VDD line select transistors 265a, . . . , 265n to apply the ground reference voltage level to the local source lines LSL0, LSL1, . . . , LSLn−1, and LSLn. A cell current Icell passes through the floating gate transistors M0 and M1 of the selected NAND-like dual floating gate transistor NOR flash memory cells 210 to the byte/word high speed sense amplifier 354. The unselected bit line select signals BLG0 and BLG1 and the unselected source line select signals SLG0 and SLG1 are set to the ground reference voltage level to deactivate the unselected local bit lines LBL0, LBL1, . . . , LBLn−1, and LBLn and the unselected local source lines LSL0, LSL1, . . . , LSLn−1, and LSLn.

The byte/word high speed sense amplifier 354 employs the first reference current Iref1 and the second reference current Iref2 to determine the internal data state of the floating gate transistors M0 connected to the selected word line WL0 or WL1. Returning to FIG. 14, the cell current Icell is compared (Box 510) to the first reference current Iref1 and the second reference current Iref2. The internal data state of the floating gate transistors M0 or M1 connected to the selected word line WL0 or WL1 are then determined (Box 520). Referring back to FIG. 4a, if the cell current Icell is determined to be greater than the first reference current Iref1 and less than the second reference current Iref2, the floating gate transistors M0 connected to the upper word line WL0 have an internal data state that is designated as a logical "1". If the cell current Icell is greater than the second reference current Iref2 or the cell current Icell is approximately zero (0.0A), the internal data state is designated as a logical "0". Upon the determination (Box 520) of the internal data state for the selected paired word line page of NAND-like dual floating gate transistor NOR flash memory cells 210, the read operation for the paired word line page of NAND-like dual floating gate transistor NOR flash memory cells 210 is ended.

The internal data is then transferred from the nonvolatile memory device 300 of FIG. 6 and decoded to determine the external logical data state. Referring to FIG. 4b, Boolean mapping from the internal data state (B0) for the first bit to the external data state (B'0) is B'0=B0 XOR B1. The Boolean mapping from the internal data state (B1) to the external data state (B'1) is B'1=B1.

While this invention has been particularly shown and described with reference to the preferred embodiments thereof, it will be understood by those skilled in the art that various changes in form and details may be made without departing from the spirit and scope of the invention. For instance, the threshold values for the floating gate transistors M0 and M1 of the paired word line page of NAND-like dual floating gate transistor NOR flash memory cells 210 may be selected to represent other internal logical states. In turn, the internal logical states may represent differing external data logical states and still be in keeping with the principles embodying the present invention.

The invention claimed is:

1. A method for operating of NAND-like dual charge retaining transistor NOR flash memory cell comprises the steps of:
   providing the NAND-like dual charge retaining transistor NOR flash memory cell wherein the NAND-like dual charge retaining transistor NOR flash memory cell comprises:
      a pair of charge retaining transistors connected serially such that a source of a first charge retaining transistor of the pair of charge retaining transistors is connected to solely to a drain of a second charge retaining transistor of the pair of charge retaining transistors;
   receiving a pair of external input data bits;
   erasing the NAND-like dual charge retaining transistor NOR flash memory cell to an erased threshold voltage level;
   keeping the first charge retaining transistor of the pair of charge retaining transistors at the erased threshold voltage level when a first input data bit of the pair of input data bits is a first datum;
   programming the first charge retaining transistor of the pair of charge retaining transistors to a first programmed threshold voltage level when the first input data bit of the pair of input data bits is a second datum;

keeping the second charge retaining transistor of the pair of charge retaining transistors at the erased threshold voltage level when a first input data bit and second input data bit are the second datum;

programming the second charge retaining transistor of the pair of charge retaining transistors to the first programmed threshold voltage level when the first data bit of the pair of input data bits and a second data bit of the pair of input data bits have unequal states of the first and second data; and programming the second charge retaining transistor to a second programmed threshold voltage level when the pair of input data bits are the first datum to prevent excess leakage current.

2. The method for operating of NAND-like dual charge retaining transistor NOR flash memory cell of claim 1 further comprises verifying over-erasing to the erased threshold voltage level of the selected NAND-like dual charge retaining transistor NOR flash memory cell.

3. The method for operating of NAND-like dual charge retaining transistor NOR flash memory cell of claim 1 further comprises program verifying the dual charge retaining transistor NOR flash memory cell subsequent to selectively programming a first charge retaining transistor of the NAND-like dual charge retaining transistor NOR flash memory cell to the first programmed threshold voltage level.

4. The method for operating of NAND-like dual charge retaining transistor NOR flash memory cell of claim 1 further comprises program verifying the dual charge retaining transistor NOR flash memory cell subsequent to selectively programming the second charge retaining transistor of the NAND-like dual charge retaining transistor NOR flash memory cell to the first programmed threshold voltage level.

5. The method for operating of NAND-like dual charge retaining transistor NOR flash memory cell of claim 1 further comprises program verifying the dual charge retaining transistor NOR flash memory cells subsequent to selectively programming the second charge retaining transistor of the NAND-like dual charge retaining transistor NOR flash memory cell to the second programmed threshold voltage level.

6. The method for operating of NAND-like dual charge retaining transistor NOR flash memory cell of claim 1 wherein the charge retaining transistors are N-channel devices and the erased threshold voltage level is a negative value less than approximately −1.8V.

7. The method for operating of NAND-like dual charge retaining transistor NOR flash memory cell of claim 1 wherein the charge retaining transistors are P-channel devices and the erased threshold voltage level is approximately +1.8V.

8. The method for operating of NAND-like dual charge retaining transistor NOR flash memory cell of claim 2 wherein subsequent to erasing and over-erase verifying the selected NAND-like dual charge retaining transistor NOR flash memory cell to an erased threshold voltage level, the first charge retaining transistor is reprogrammed to the first programmed threshold voltage level to prevent leakage currents leakage current from corrupting data during a read or verification operation.

9. The method for operating of NAND-like dual charge retaining transistor NOR flash memory cell of claim 1 wherein the first datum is a logical "0" and the second datum is a logical "1".

10. The method for operating of NAND-like dual charge retaining transistor NOR flash memory cell of claim 1 wherein the charge retaining transistors are N-channel devices, the first programmed threshold voltage level is a positive value of from approximately +0.75V to approximately +1.25V (nominally +1.0V), and the second programmed threshold voltage level is a positive value of at least +5.0V.

11. The method for operating of NAND-like dual charge retaining transistor NOR flash memory cell of claim 1 wherein the charge retaining transistors are P-channel devices, the first programmed threshold voltage level is a negative value of from approximately −0.75V to approximately −1.25V (nominally −1.0V), and the second programmed threshold is a positive value of at least −5.0V.

12. The method for operating of NAND-like dual charge retaining transistor NOR flash memory cell of claim 1 further comprising reading an external data logical state of the NAND-like dual charge retaining transistor NOR flash memory cell by:

applying the pass voltage level to a gate of the first charge retaining transistor of the NAND-like dual charge retaining transistor NOR flash memory cell;

applying read reference voltage level to the gate of the second charge retaining transistor of the NAND-like dual charge retaining transistor NOR flash memory cell;

applying a read voltage level to a source/drain of the first charge retaining transistor;

applying a ground reference voltage level to a source/drain of the second charge retaining transistor;

comparing a cell current to a first reference current and a second reference current to determine an internal data state of the first charge retaining transistor of the NAND-like dual charge retaining transistor cell;

applying the pass voltage level to a gate of the second charge retaining transistor of the NAND-like dual charge retaining transistor NOR flash memory cell;

applying a read reference voltage level to the gate of the first charge retaining transistor of the NAND-like dual charge retaining transistor NOR flash memory cell;

comparing the cell current to the first reference current and the second reference current to determine the internal data state of the second charge retaining transistor of the NAND-like dual charge retaining transistor NOR flash memory cell; and decoding the internal data states of the first and second charge retaining transistors to determine the external data logical state of the NAND-like dual charge retaining transistor NOR flash memory cell as programmed with the external input data bits.

13. The method for operating of NAND-like dual charge retaining transistor NOR flash memory cell of claim 12 wherein the read reference voltage level is approximately 2.7V, the pass voltage level is approximately 4.5V, and the read voltage level is approximately +1.0V.

14. A nonvolatile memory device comprising:

an array of NAND-like dual charge retaining transistor NOR flash memory cells is arranged in rows and columns, wherein each of the NAND-like dual charge retaining transistor NOR flash memory cells comprise:

a pair of charge retaining transistors connected serially such that a source of a first charge retaining transistor of the pair of charge retaining transistors is connected to solely to a drain of a second transistor of the pair of charge retaining transistors;

means for receiving a pair of external input data bits;

means for keeping the first charge retaining transistor of the pair of charge retaining transistors of selected NAND-like dual charge retaining transistor NOR flash memory cells at the erased threshold voltage level when a first input data bit of the pair of input data bits is a first datum;

means for programming the first charge retaining transistor of the pair of charge retaining transistors of selected NAND-like dual charge retaining transistor NOR flash memory cells to a first programmed threshold voltage level when the first input data bit of the pair of input data bits is a second datum;

means for keeping the second charge retaining transistor of the pair of charge retaining transistors of selected NAND-like dual charge retaining transistor NOR flash memory cells at the erased threshold voltage level when a first input data bit and second input data bit are the second datum;

means for programming the second charge retaining transistor of the pair of charge retaining transistors of selected NAND-like dual charge retaining transistor NOR flash memory cells to the first programmed threshold voltage level when the first data bit of the pair of input data bits and a second data bit of the pair of input data bits have unequal states of the first and second data; and means for programming the second charge retaining transistor of the pair of charge retaining transistors of selected NAND-like dual charge retaining transistor NOR flash memory cells to a second programmed threshold voltage level when the pair of input data bits are the first datum to prevent excess leakage current.

15. The nonvolatile memory device of claim 14 further comprises means for verifying over-erasing to the erased threshold voltage level of the selected NAND-like dual charge retaining transistor NOR flash memory cells.

16. The nonvolatile memory device of claim 14 further comprises means for program verifying the selected NAND-like dual charge retaining transistor NOR flash memory cells subsequent to selectively programming a first charge retaining transistor of the selected NAND-like dual charge retaining transistor NOR flash memory cells to the first programmed threshold voltage level.

17. The nonvolatile memory device of claim 14 further comprises means for program verifying the NAND-like dual charge retaining transistor NOR flash memory cells subsequent to selectively programming the second charge retaining transistor of the selected NAND-like dual charge retaining transistor NOR flash memory cells to the first programmed threshold voltage level.

18. The nonvolatile memory device of claim 14 further comprises means for program verifying the NAND-like dual charge retaining transistor NOR flash memory cells subsequent to selectively programming the second of two charge retaining transistors of the selected NAND-like dual charge retaining transistor NOR flash memory cells to the second programmed threshold voltage level.

19. The nonvolatile memory device of claim 14 wherein the charge retaining transistors are N-channel devices and the erased threshold voltage level is a negative value less than approximately −1.8V.

20. The nonvolatile memory device of claim 14 wherein the charge retaining transistors are P-channel devices and the erased threshold voltage level is approximately +1.8V.

21. The nonvolatile memory device of claim 15 wherein subsequent to erasing and over-erase verifying the selected NAND-like dual charge retaining transistor NOR flash memory cells to an erased threshold voltage level, the first charge retaining transistor is reprogrammed to the first programmed threshold voltage level to prevent leakage currents leakage current from corrupting data during a read or verification operation.

22. The nonvolatile memory device of claim 14 wherein the first first datum is a logical "0" and the second datum is a logical "1".

23. The nonvolatile memory device of claim 14 wherein the charge retaining transistors are N-channel devices, the first programmed threshold voltage level is a positive value of from approximately +0.75V to approximately +1.25V (nominally +1.0V), and the second programmed threshold voltage level is a positive value of at least +5.0V.

24. The nonvolatile memory device of claim 14 wherein the charge retaining transistors are P-channel devices, the first programmed threshold voltage level is a negative value of from approximately −0.75V to approximately −1.25V (nominally −1.0V), and the second programmed threshold is a positive value of at least −5.0V.

25. The nonvolatile memory device of claim 14 further comprising means for reading an external data logical state of the selected NAND-like dual charge retaining transistor NOR flash memory cells comprising:

means for applying the pass voltage level to a gate of the first charge retaining transistor of the selected NAND-like dual charge retaining transistor NOR flash memory cells;

means for applying a read reference voltage level to the gate of the second charge retaining transistor of the selected NAND-like dual charge retaining transistor NOR flash memory cells;

means for applying a read voltage reference level to a source/drain of the first charge retaining transistor;

means for applying a ground reference voltage level to a source/drain of the second charge retaining transistor;

means for comparing a cell current to a first reference current and a second reference current to determine an internal data state of the first charge retaining transistor of the NAND-like dual charge retaining transistor;

means for applying the pass voltage level to a gate of the second charge retaining transistor of the selected NAND-like dual charge retaining transistor NOR flash memory cells;

means for applying a read reference voltage level to the gate of the first charge retaining transistor of the selected NAND-like dual charge retaining transistor NOR flash memory cells;

means for comparing the cell current to the first reference current and the second reference current to determine the internal data state of the second charge retaining transistor of the selected NAND-like dual charge retaining transistor NOR flash memory cells; and means for decoding the internal data states of the first and second charge retaining transistors to determine the external data logical state of the selected NAND-like dual charge retaining transistor NOR flash memory cells as programmed with the external input data bits.

26. The nonvolatile memory device of claim 25 wherein the read reference voltage level is approximately 2.7V, the pass voltage level is approximately 4.5V, and the read voltage level is approximately +1.0V.

27. A nonvolatile memory device comprising:

an array of NAND-like dual charge retaining transistor NOR flash memory cells is arranged in rows and columns, each of the NAND-like dual charge retaining transistor NOR flash memory cells comprising;

a first charge retaining transistor and a second charge retaining transistor are serially connected such that a source of a first charge retaining transistor of the pair of charge retaining transistors is connected to solely to a drain of a second transistor of the pair of charge retaining transistors;

wherein selected first charge retaining transistor and the second charge retaining transistor of each of the NAND-like dual charge retaining transistor NOR flash memory cells are programmed to store a pair of external input data bits by the steps of:

keeping the first charge retaining transistor of the pair of charge retaining transistors at the erased threshold voltage level when a first input data bit of the pair of input data bits is a first datum;

programming the first charge retaining transistor of the pair of charge retaining transistors to a first programmed threshold voltage level when the first input data bit of the pair of input data bits is a second datum;

keeping the second charge retaining transistor of the pair of charge retaining transistors at the erased threshold voltage level when a first input data bit and second input data bit are the second datum;

programming a second charge retaining transistor of the pair of charge retaining transistors to the first programmed threshold voltage level when the first data bit of the pair of input data bits and a second data bit of the pair of input data bits have unequal states of the first and second data; and programming the second charge retaining transistor to a second programmed threshold voltage level when the pair of input data bits are the first datum to prevent excess leakage current, wherein selected NAND-like dual charge retaining transistor NOR flash memory cells are read by biasing selected NAND-like dual charge retaining transistor NOR flash memory cells to create a cell current through each of the selected NAND-like dual charge retaining transistor NOR flash memory cells and comparing the cell current to a plurality of reference currents and from the relationship of the cell current of the selected NAND-like dual charge retaining transistor NOR flash memory cells to the plurality of reference currents, determining an internal data state for each of the selected NAND-like dual charge retaining transistor NOR flash memory cells;

wherein the determined data states are decoded to ascertain external data logical states retained by the selected NAND-like dual charge retaining transistor NOR flash memory cells as programmed with the external input data bits.

* * * * *